US 7,443,718 B2

(12) United States Patent
Ito et al.

(10) Patent No.: US 7,443,718 B2
(45) Date of Patent: Oct. 28, 2008

(54) MAGNETIC MEMORY DEVICE

(75) Inventors: Kenchi Ito, Cambridgeshire (GB);
Hiromasa Takahashi, Hactioji (JP);
Takayuki Kawahara, Higashi-yamato (JP); Riichiro Takemura, Suginami-ku (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/606,187

(22) Filed: Nov. 30, 2006

(65) Prior Publication Data

US 2007/0258281 A1 Nov. 8, 2007

(30) Foreign Application Priority Data

May 4, 2006 (EP) ................................. 06113535

(51) Int. Cl.
*G11C 11/00* (2006.01)
(52) U.S. Cl. ................................. 365/158; 365/189.01
(58) Field of Classification Search ................. 365/158, 365/189.011, 189.01, 213
See application file for complete search history.

(56) References Cited

U.S. PATENT DOCUMENTS

| | | | |
|---|---|---|---|
| 6,791,873 B1 | 9/2004 | Perner | |
| 6,826,086 B1 | 11/2004 | Smith et al. | |
| 6,956,763 B2 * | 10/2005 | Akerman et al. | 365/158 |
| 6,980,468 B1 | 12/2005 | Ounadjela | |
| 6,992,910 B1 | 1/2006 | Kochan et al. | |
| 2005/0047198 A1 * | 3/2005 | Engel et al. | 365/158 |

OTHER PUBLICATIONS

Devolder, T. et al, "Precharging Stragegy to Accelerate Spin-Transfer Switching Below the nanosecond," Applied Physics Letters 86, 2005 American Institute of Physics, pp. 062505-1-062505-3 (3 pages).
Recent Developments in Magnetic Tunnel Junction MRAM, Tehrani et al., IEEE Transactions on Magnetics, vol. 36, p. 2752 (2000).
Emission of Spin Waves by a Magnetic Multilayer Traversed by a Current, Berger, Physical Review, vol. 54 p. 9353 (1996).
Highly Scalable MRAM using Field Assisted current Induced Switching, Jeong et al. 2005 Symposium on VLSI technology Digest of Technical Papers, p. 184.

* cited by examiner

*Primary Examiner*—Richard T. Elms
*Assistant Examiner*—Toan Le
(74) *Attorney, Agent, or Firm*—Antonelli, Terry, Stout & Kraus, LLP.

(57) ABSTRACT

A magnetic memory device comprises a magnetic tunnel junction (MTJ) having a ferromagnetic free layer, and exhibits a first, relatively high resistance state, and a second, relatively low resistance state. To write to the magnetic memory device a current $I_{MTJ}$ is driven through the MTJ. For a first duration, the current is equal to a DC threshold current, being the DC current required to switch the multilayer structure between the first state and the second state. This induces a C-like domain structure in the free layer. For a second duration, the current $I_{MTJ}$ is larger than the DC threshold current. This causes the MTJ to switch states. The current requited to cause switching is less than that required using a uniform current pulse.

19 Claims, 18 Drawing Sheets

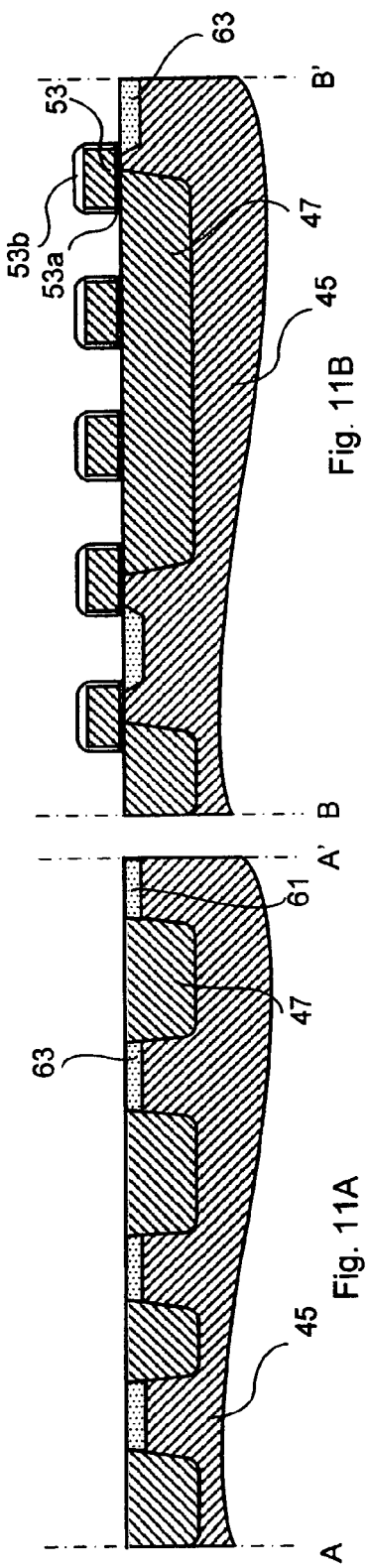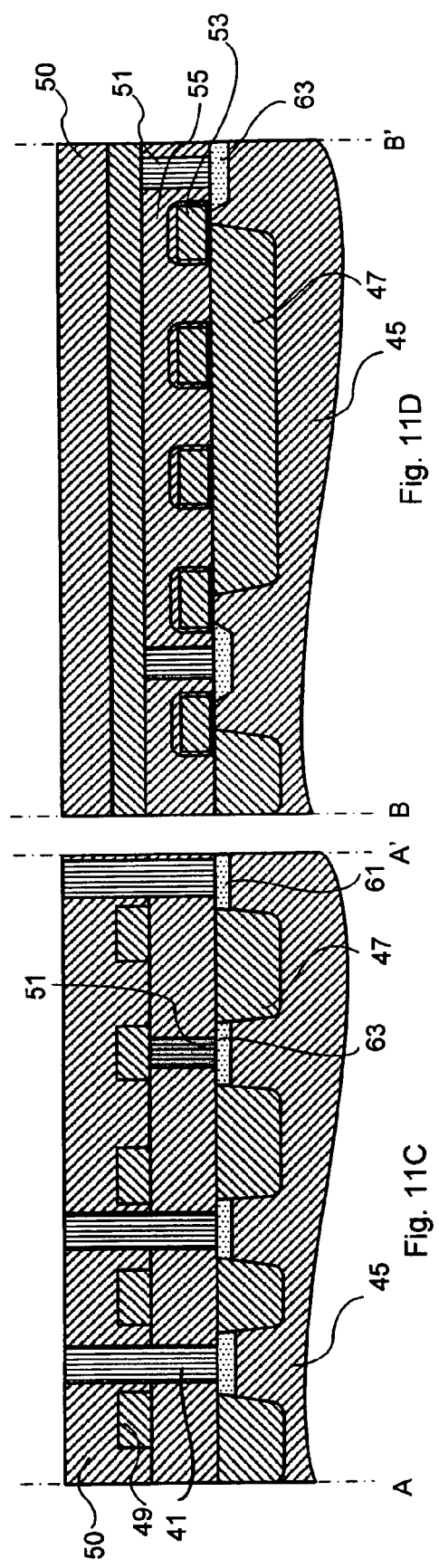

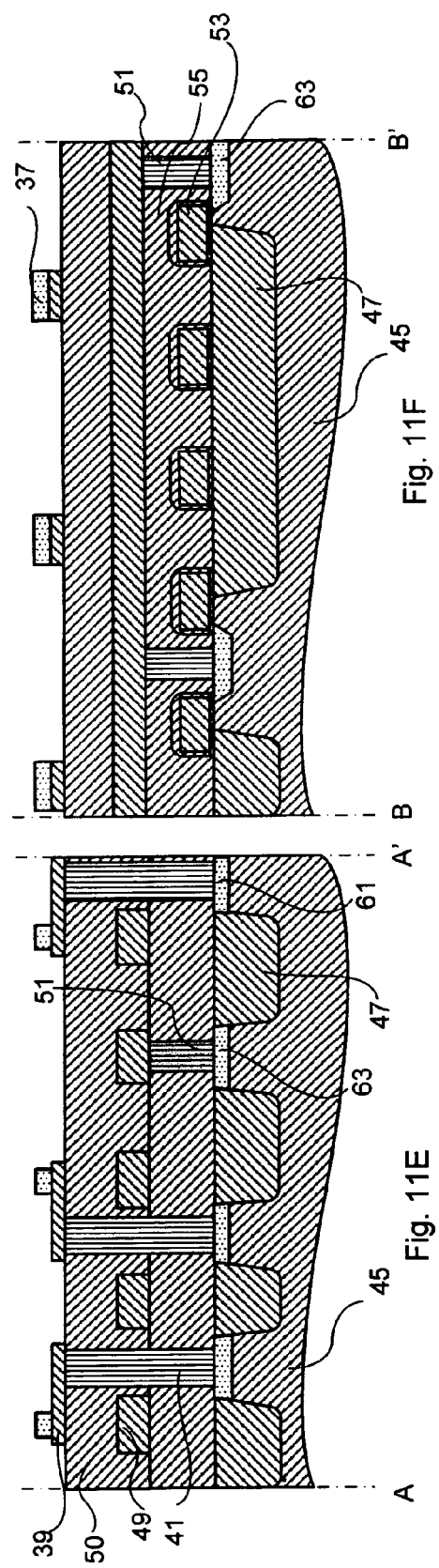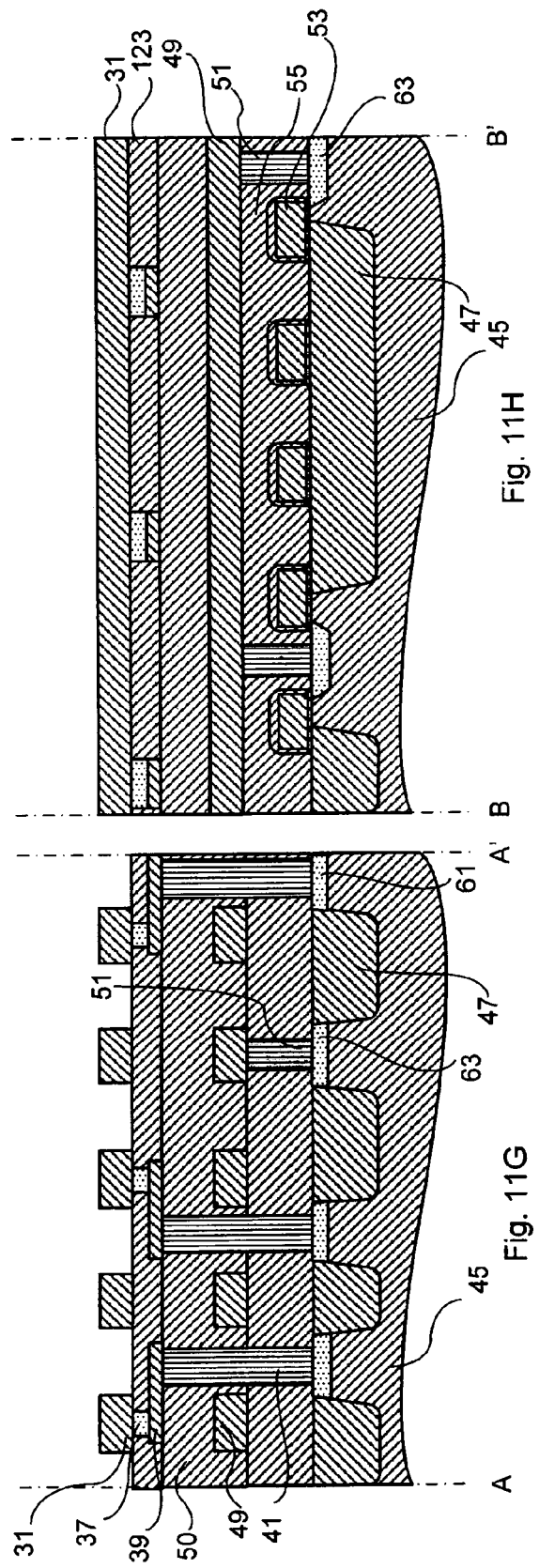

MAGNETIC MEMORY DEVICE

FIELD OF THE INVENTION

The present invention relates to a magnetic memory device and in particular, although not exclusively, to a magnetic random access memory. The present invention relates also to a method of writing to a magnetic memory device.

BACKGROUND ART

The emergence of magnetic random access memory (MRAM) is a promising step for the development of both long-term and short-term data storage. MRAM has the benefit of being non-volatile, while having a lower energy consumption and faster read and write time than Flash memory. MRAM also has a lower energy consumption than the commonly used volatile memories dynamic RAM (DRAM) and static RAM (SRAM), with a read and write time faster than that of DRAM.

A conventional MRAM cell comprises a magnetic element having a ferromagnetic free layer and a ferromagnetic pinned layer, separated by a non-magnetic layer. The pinned layer has a relatively high coercivity, so that its magnetisation remains fixed upon the application of a writing magnetic field. The free layer has a relatively low coercivity, so that its magnetisation can be changed upon application of the writing magnetic field.

To write to the MRAM cell, the writing magnetic field is applied to switch the magnetisation of the free layer to be either parallel or anti-parallel to the pinned layer. The free layer exhibits magnetic hysteresis, thus its magnetisation remains unchanged when the magnetic field is removed. This results in a non-volatile memory.

To read the state of the MRAM cell, a small current is driven through the magnetic element. The magnetoresistance of the magnetic element will be higher when the magnetisations of the free layer and the pinned layer are antiparallel, than when the magnetisations of the free layer and the pinned layer are parallel. In this way, the state of the magnetic element can be determined by measuring its resistance.

A conventional MRAM is described in "Recent Developments in Magnetic Tunnel Junction MRAM" by S. Tehrani et al., p.2752-2757, IEEE Transactions on Magnetics, Vol. 36, No. 5 (September 2000).

Such a conventional MRAM suffers from the disadvantage that as the size of the MRAM cell decreases, the magnetic field required to switch the magnetisation of the free layer increases. Therefore, the power consumption of the device increases as the cell size decreases.

Another technique used to write to a magnetic element is spin-transfer-torque (STT) switching. STT switching is described in "Current-driven Excitation of Magnetic Multilayers" by J. C. Slonczewski, p.9353, Phys. Rev. B, Vol. 54 (1996). To switch the magnetisation of the free layer, instead of applying a magnetic field, a current is driven through the magnetic element perpendicular to the plane of the free and pinned layers. This can result in the injection of spin-polarised electrons into the free layer, either by electrons flowing through the pinned layer, when current is driven from the free layer to the pinned layer, or by electrons scattering from the pinned layer 85, when current is driven from the pinned layer to the free layer.

When spin polarised electrons are injected into the free layer, their spin angular momentum interacts with the magnetic moments in the free layer. The electrons transfer a portion of their angular momentum to the free layer. This results in switching the magnetisation of the free layer when the spin-polarised current is large enough.

An MRAM utilising STT switching is described in "Highly scalable MRAM using field assisted current induced switching" by W. C. Jeong et al., p.184, 2005 Symposium on VLSI Technology Digest of Technical Papers.

The current required for STT switching decreases as the cell size decreases. Therefore, high density MRAM can be realised with STT switching. For DC current, the threshold current density for STT switching depends on material constants such as the saturation magnetisation, Gilbert's damping constant, and the spin polarisations of both the pinned and free layers. However, the required current for a nano-second pulse is much larger than the DC threshold current. It has been shown that the required current in the nano-second regime is given by $$I = I_{c0}(1 + C \cdot t_p^{-1}) \qquad (1)$$

where C is a constant, and $I_{c0}$ is the DC threshold current. According to equation (1) above, the current required to switch the magnetisation for a 1 ns pulse is four times the DC threshold current. Therefore, STT switching MRAMs having a fast write time will have large power consumption.

Another MRAM is described in "A Novel Non-volatile Memory with Spin Torque Transfer Magnetization Switching: Spin-RAM" by M. Hosomi et al., p. 19.1, IEEE International Electronic Device Meeting 2005, which shows that the current required for STT switching increases significantly in the nano-second regime.

In "Precharging strategy to accelerate spin-transfer switching below the nanosecond" by T. Devolder et al., Appl. Phys. Lett., 86, pp. 062505 (2005), an MRAM is described in which a DC bias current is applied in addition to a short RF current pulse. This can reduce the current required for STT switching in the nano-second regime. However, using a DC bias current dramatically increases the total power consumption of the MRAM.

In addition, MRAMs utilising STT switching have an intrinsic probability distribution in the switching current. This is caused by the distribution of the initial magnetisation direction of the free layer due to thermal fluctuations. To ensure error free switching, in all the MRAM cells, the switching current is increased. In addition, the difference between the writing current and the reading current is decreased.

The present invention seeks to ameliorate at least some of the above-identified problems.

SUMMARY OF THE INVENTION

According to a first aspect of the present invention there is provided a method of writing to a magnetic memory device comprising: first and second leads; and a magnetoresistive multilayer structure arranged between said leads, said multilayer structure exhibiting a first, relatively high resistance state and a second, relatively low resistance state, the multilayer structure being switchable from the first state to the second state in response to a pulse of given duration and magnitude, the pulse magnitude being a current threshold magnitude which is a minimum current magnitude needed to switch the multilayer structure and which is dependent upon the duration of the pulse, the method comprising: passing a current through the multilayer structure of first magnitude less than said threshold current magnitude, and increasing the current through the multilayer structure thereby passing a current of second, higher magnitude which is less than said threshold magnitude.

Such a method can greatly reduce the current required to switch the multilayer structure and this can be achieved without significantly increasing the total power consumption of the memory device.

Passing the current through the multilayer structure may comprise passing the current through the multilayer structure of first magnitude less than said threshold current magnitude for a duration less than the given duration.

Passing the current through the multilayer structure may comprise passing the current through the multilayer structure of first magnitude between 0.1 and 0.5 of said current threshold magnitude.

Passing the current through the multilayer structure of first magnitude may comprises passing the current through the multilayer structure for between 0.1 and 0.4 of the given duration. The given duration may be less than 10 ns.

Passing the current through the multilayer structure of first magnitude may comprise passing the current through the multilayer structure at a fixed level for the duration.

Passing the current through the multilayer structure may comprise passing the current through the multilayer structure of first magnitude less than or equal to a DC threshold current, being the minimum DC current needed to switch the multilayer structure.

Passing the current through the multilayer structure may comprises passing a current through the multilayer structure of first magnitude less than said threshold current magnitude for a duration between 1 ns and 2 ns.

Increasing the current may comprise increasing the current to a second magnitude between 0.3 and 0.5 of said threshold magnitude.

Increasing the current may comprise increasing the current to a predetermined level and holding the current at that level for a period less than the given duration.

Increasing the current may comprise increasing the current to a predetermined level and holding the current at that level for a period between 0.1 and 0.4 of the given duration. The given duration may be less than 10 ns.

Increasing the current may comprise increasing the current to a predetermined level an holding the current at a fixed level.

The method may further comprise ramping current from a base current level to a predetermined current level.

The method may further comprise ramping current from a zero current level to a predetermined current level.

The method may further comprise ramping current up from the predetermined current level to the level of the current of a second, higher magnitude.

The method may further comprise ramping current down from the level of the current of a second, higher magnitude to a lower level.

The method may further comprise ramping current down from the level of the current of a second, higher magnitude to the base level.

The current threshold magnitude I needed to switch the multilayer structure may be $I=I_{c0}(1+C \cdot t_p^{-1})$ where $I_{c0}$ is a DC threshold current being the minimum DC current needed to switch the multilayer structure, C is a constant, and $t_p$ is the duration of the pulse.

According to a second aspect of the present invention there is provided a memory comprising: a magnetic memory device comprising: first and second leads; and a magnetoresistive multilayer structure arranged between said leads, said multilayer structure exhibiting a first, relatively high resistance state and a second, relatively low resistance state, the multilayer structure being switchable from the first state to the second state in response to a pulse of given duration and magnitude, the pulse magnitude being a current threshold magnitude which is a minimum current magnitude needed to switch the multilayer structure and which is dependent upon the duration of the pulse; and circuitry for controlling the magnetic memory device configured to perform the method.

In such a magnetic memory device, a lower switching current can be used. Also, the probability of the switching current can be reduced.

DETAILED DESCRIPTION OF THE DRAWINGS

Embodiments of the present invention will now be described, by way of example, with reference to FIGS. 3A to 15 of the accompanying drawings in which.

Figure 3A:
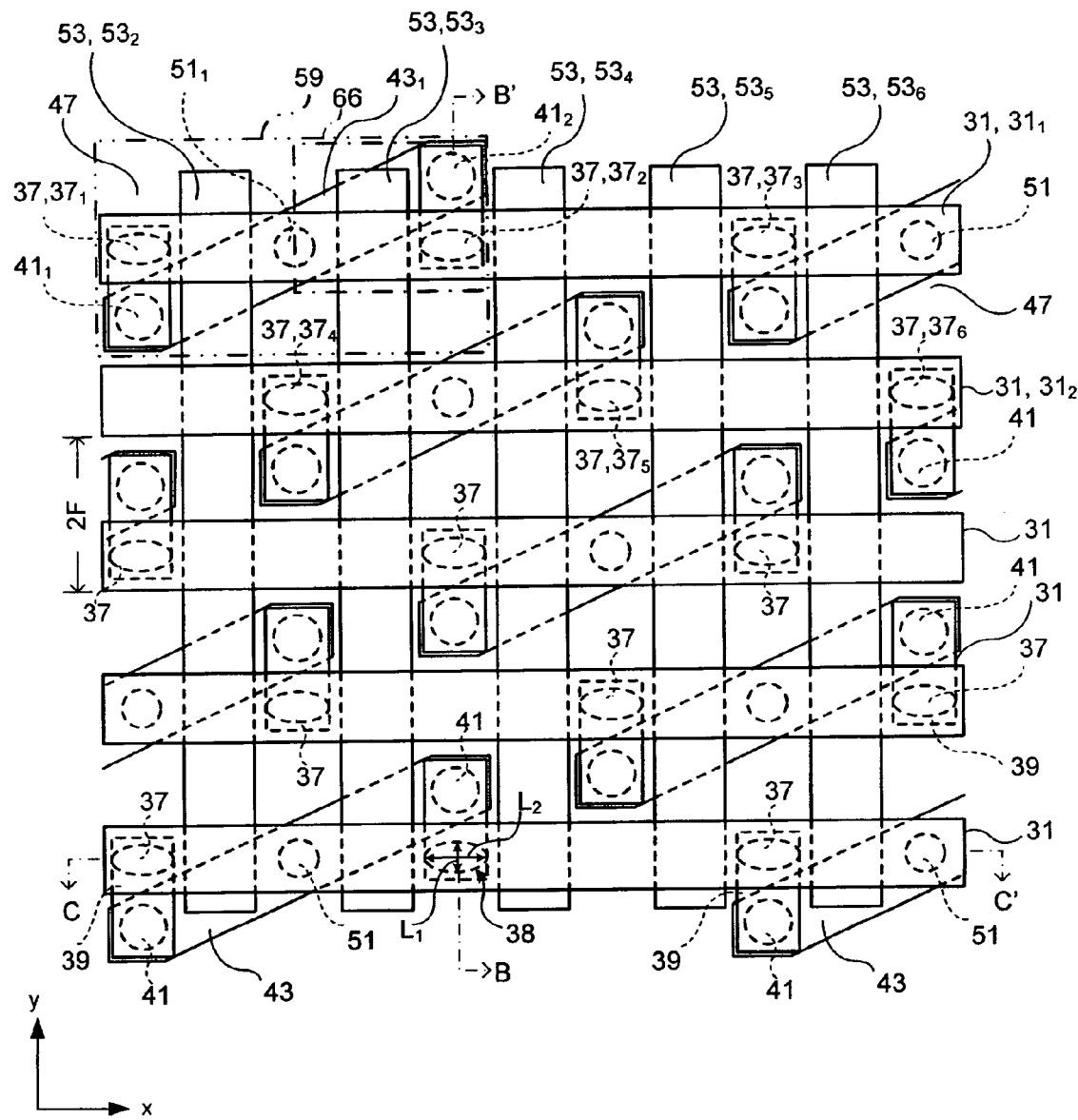
FIG. 3A is a plan view of a memory array comprising an embodiment of a magnetic memory device.
Figure 9A:
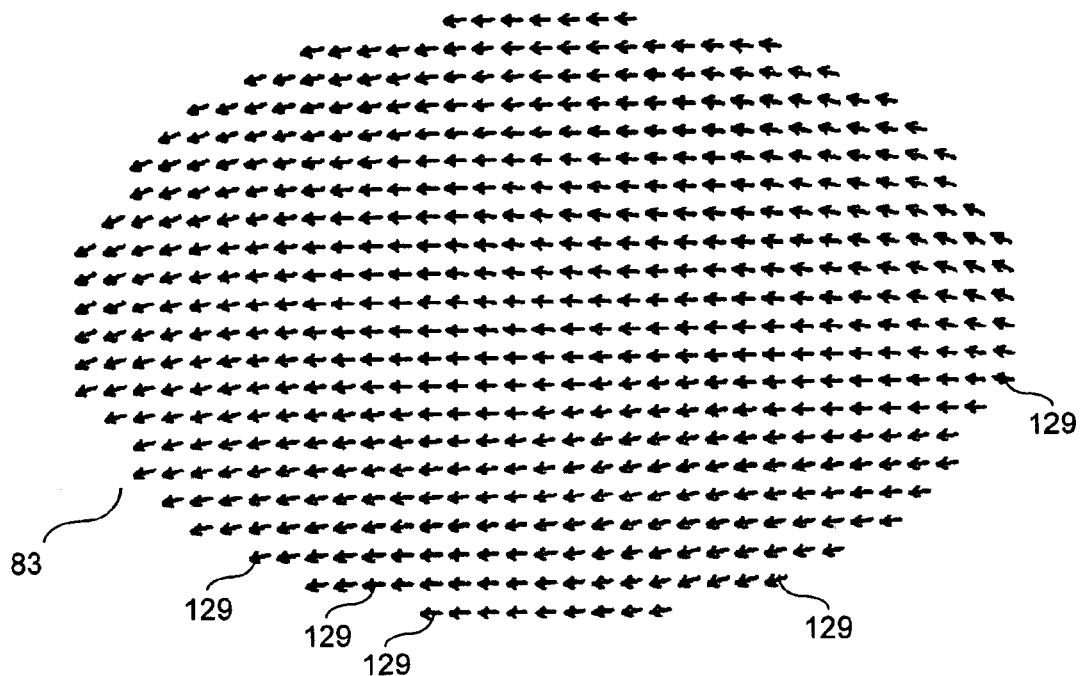
Figure 10A:
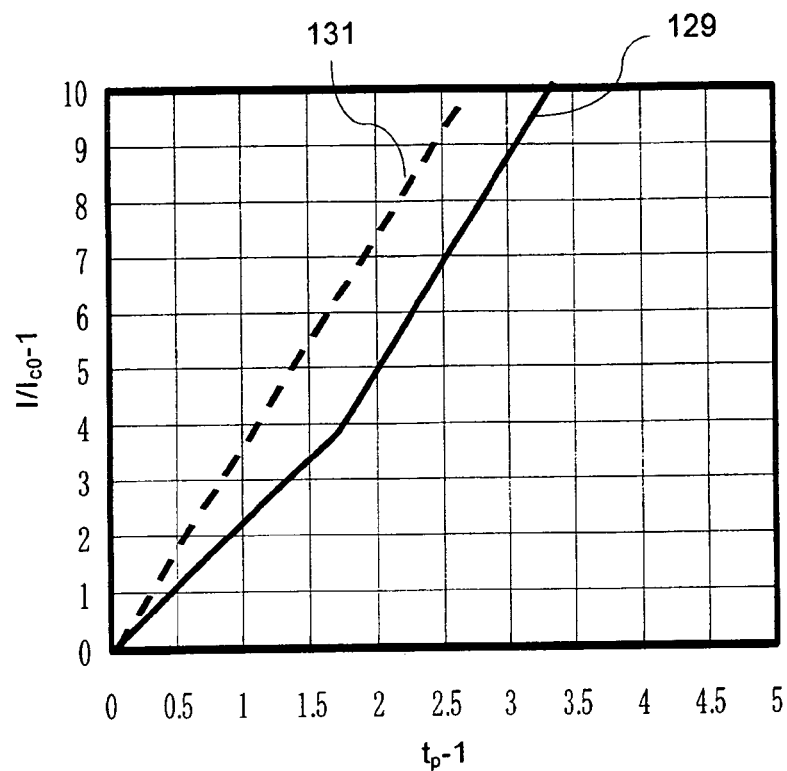
Figure 10B:
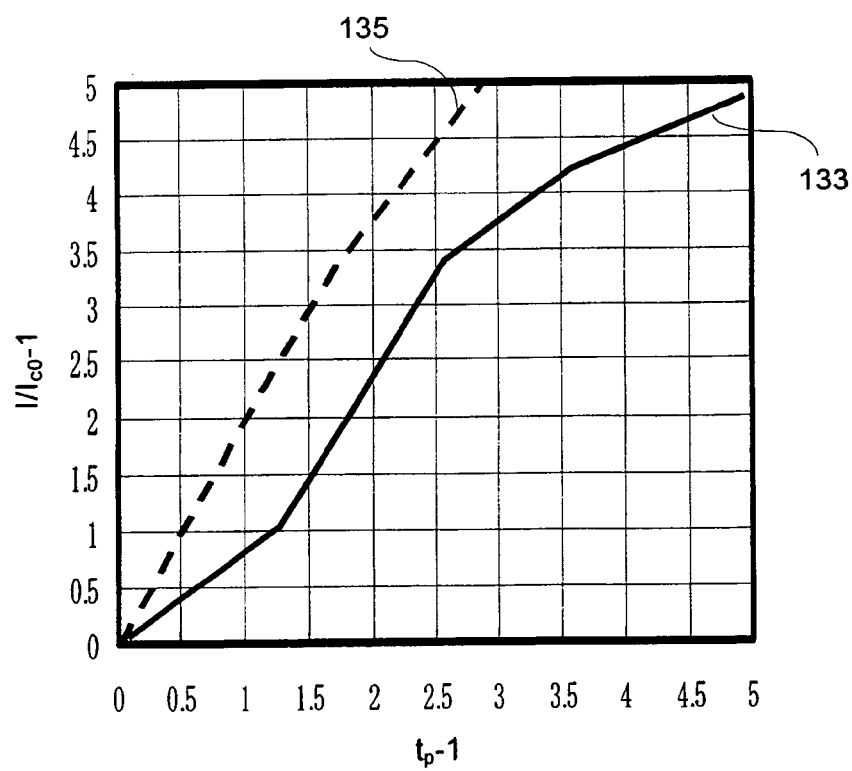
Figure 12A:
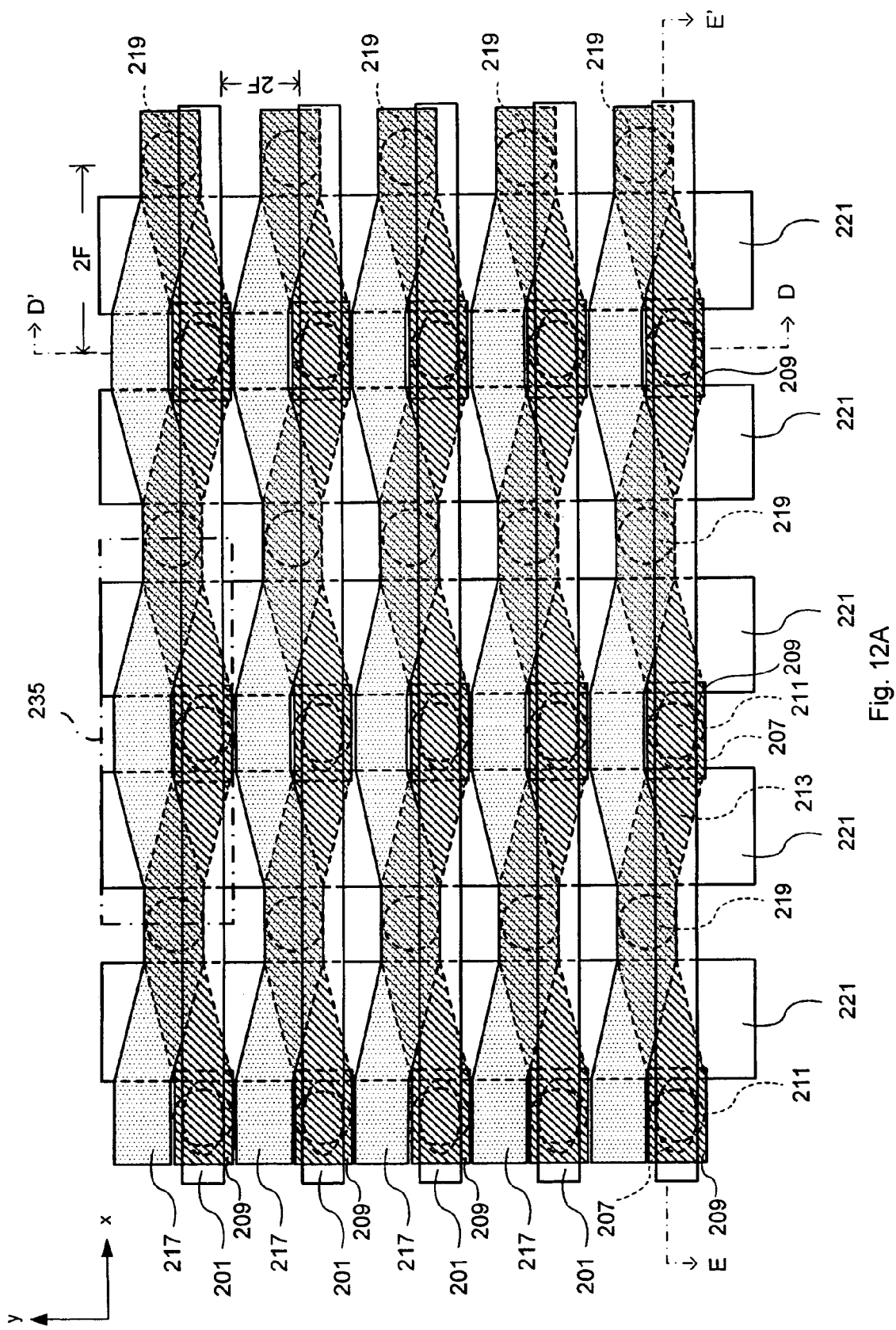
Figure 12B:
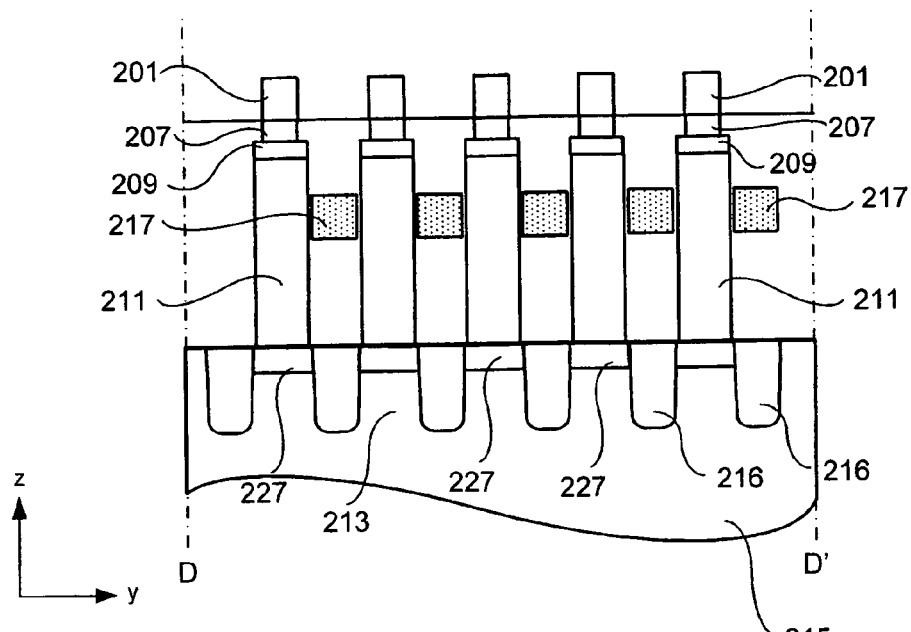
Figure 12C:
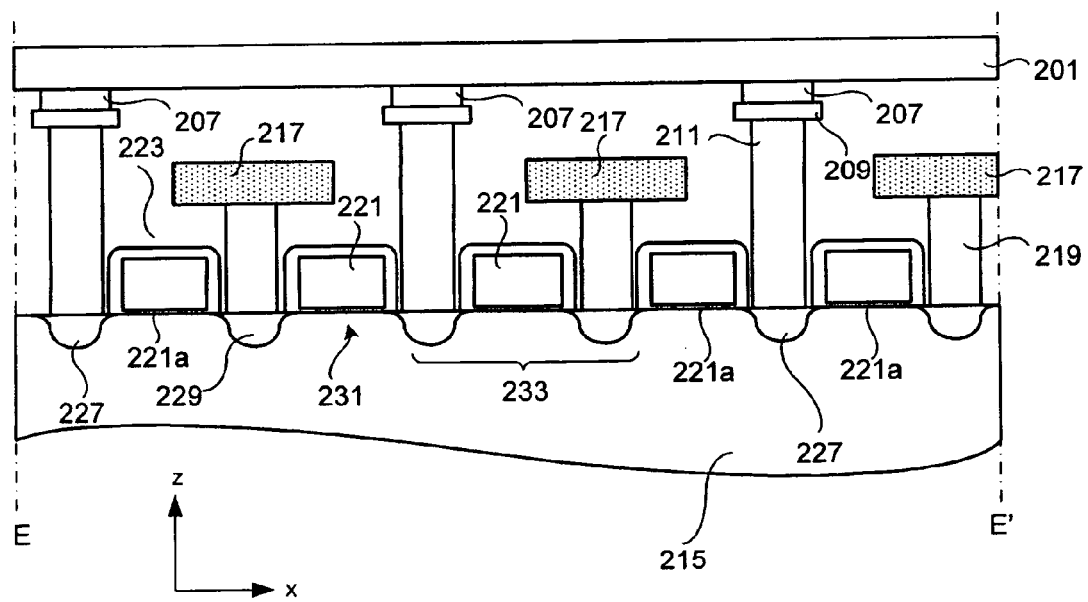
Figure 13:
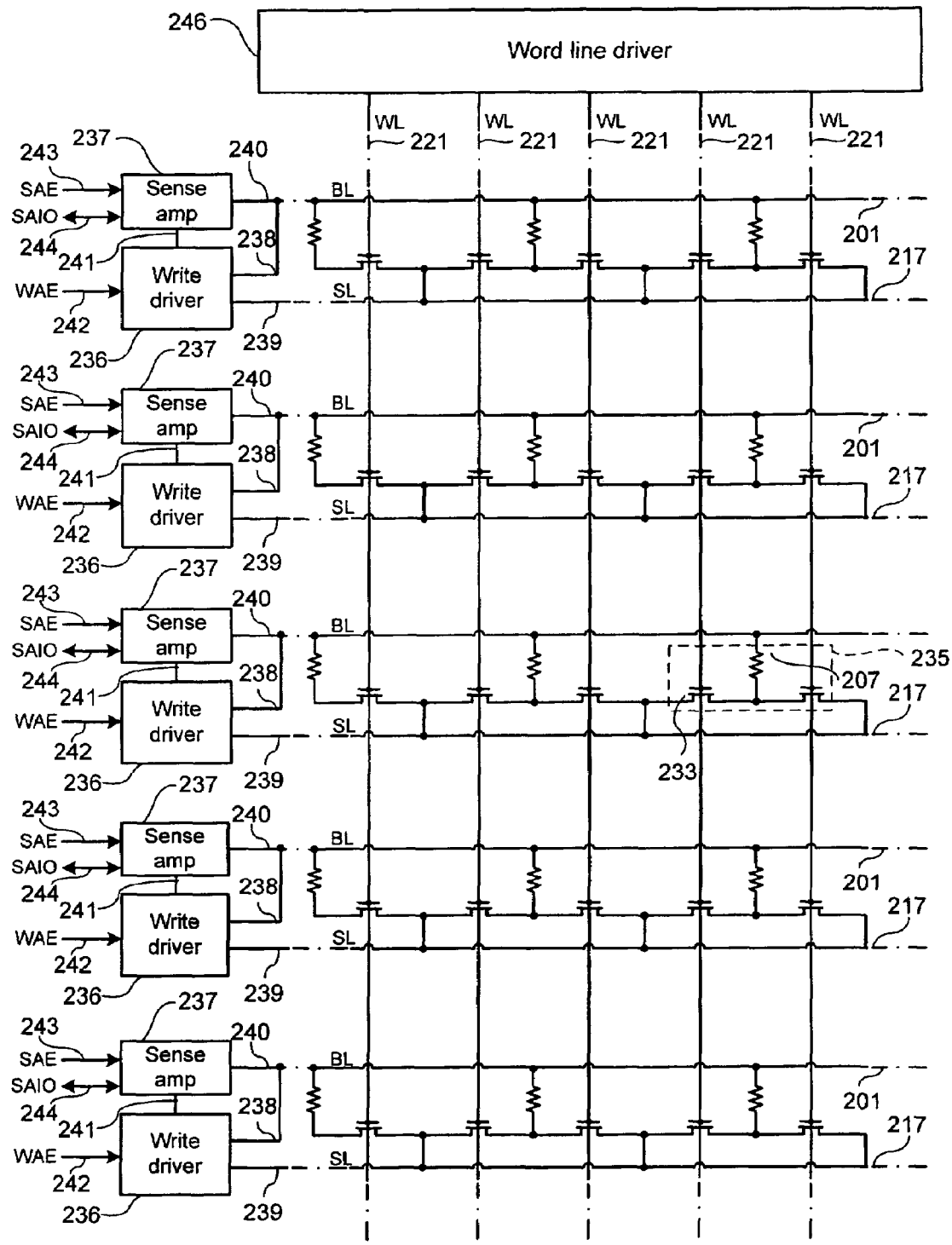
Figure 14:
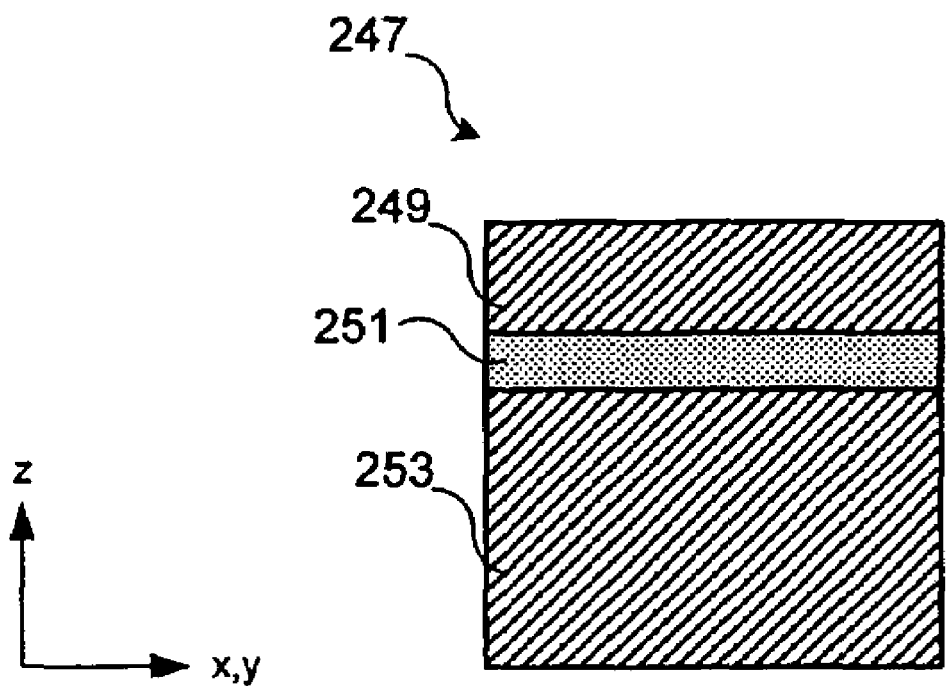
Figure 15:
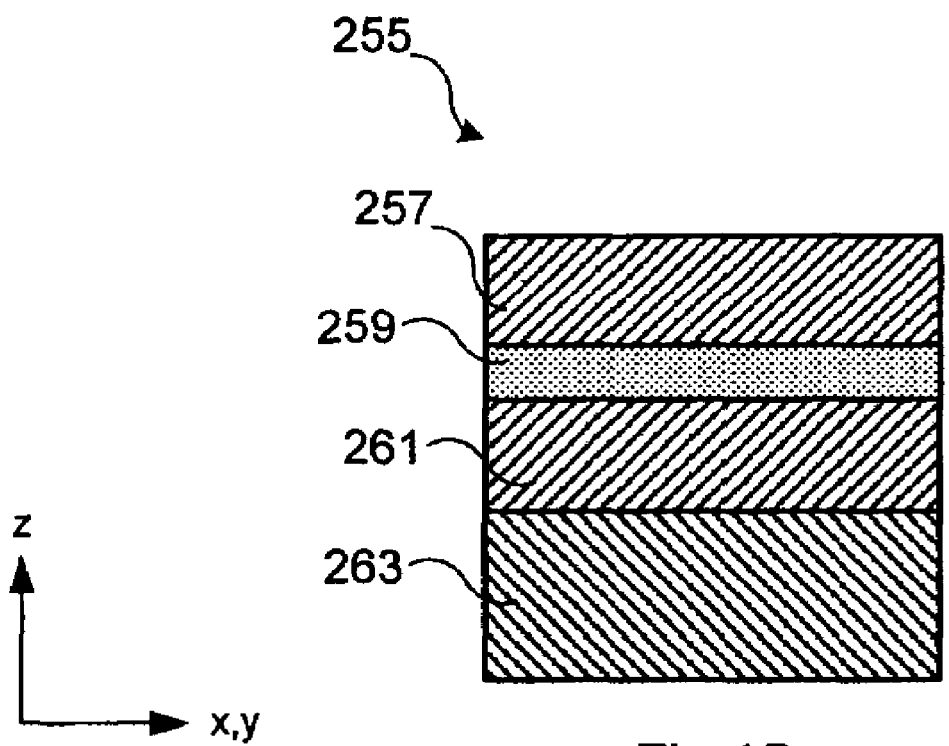

FIGS. 9A to 9F ate schematic illustrations of magnetisations of a free layer and a pinned layer in the memory array shown in FIG. 3A, at various times of the write cycle;

FIGS. 10A and 10B are plots of STT switching current against pulse duration;

FIGS. 11A to 11H show a method of fabricating the device shown in FIG. 3A;

FIG. 12A is a plan view of a memory array comprising an embodiment of a magnetic memory device;

FIG. 12B is a cross section of the memory array shown in FIG. 9A taken along a line D-D';

FIG. 12C is a cross section of the memory array shown in FIG. 9A taken along a line E-E';

FIG. 13 illustrates control circuitry for the memory array shown in FIG. 9A;

FIGS. 14 and 15 illustrate cross sections of other magnetic tunnel junctions, in accordance with certain embodiments of the present invention.

CONVENTIONAL MRAM

Device Layout

Figure 1:
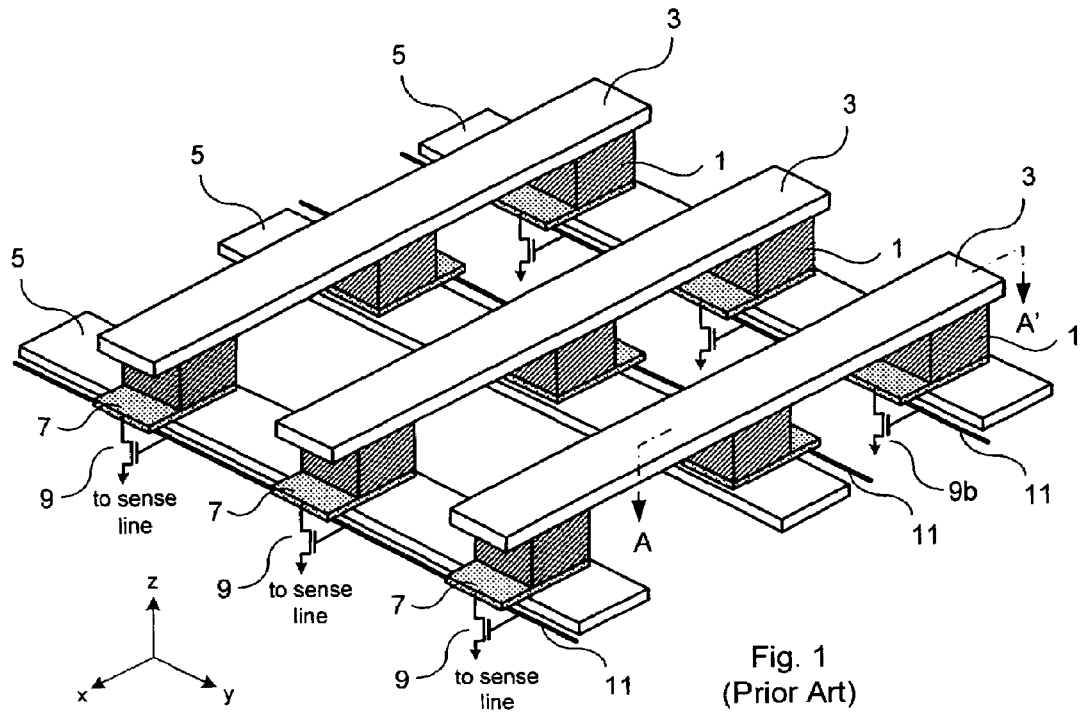
FIG. 1 is a schematic of a prior art magnetic random access memory (MRAM) array.

Referring to FIG. 1, a schematic of a prior art MRAM array is shown. The MRAM array is arranged in a cross-point architecture, with a magnetic tunnel junction (MTJ) 1 between each intersection of one of a plurality of bit lines 3 and one of a plurality of digit lines 5 arranged perpendicular to the bit lines 3. Therefore, each tow of the artay is defined by a bit line 3 and each column of the array is defined by a digit line 5.

The MTJ 1 is in electrical contact with the bit line 3. However, the MTJ 1 is electrically isolated from the digit line 5 by an insulating matrix 18.

The MTJ 1 has a magnetic easy axis in the plane of the MTJ 1 (defined herein as the x-y plane) and a magnetic hard axis in the plane of the MTJ 1. In this example, the magnetic easy axis is defined to be parallel to the x-axis, and the magnetic hard axis is defined to be parallel to the y-axis. The bit line 3 is aligned parallel to the easy axis of the MTJ 1 i.e. aligned parallel to the x-axis. The digit line 5 is aligned parallel to the hard axis of the MTJ 1 i.e. aligned parallel to the y-axis. Each MTJ 1 is disposed on a bottom electrode 7. Each bottom electrode 7 is connected to an isolation transistor 9, 9a, 9b. Each isolation transistor 9, 9a, 9b is connected to a sense line (not shown). Word lines 11 run parallel to the digit lines 5 i.e. parallel to the y-axis. Each word line 11 is connected to the gate of all the transistors 9, 9a, 9b in a single column.

Figure 2:
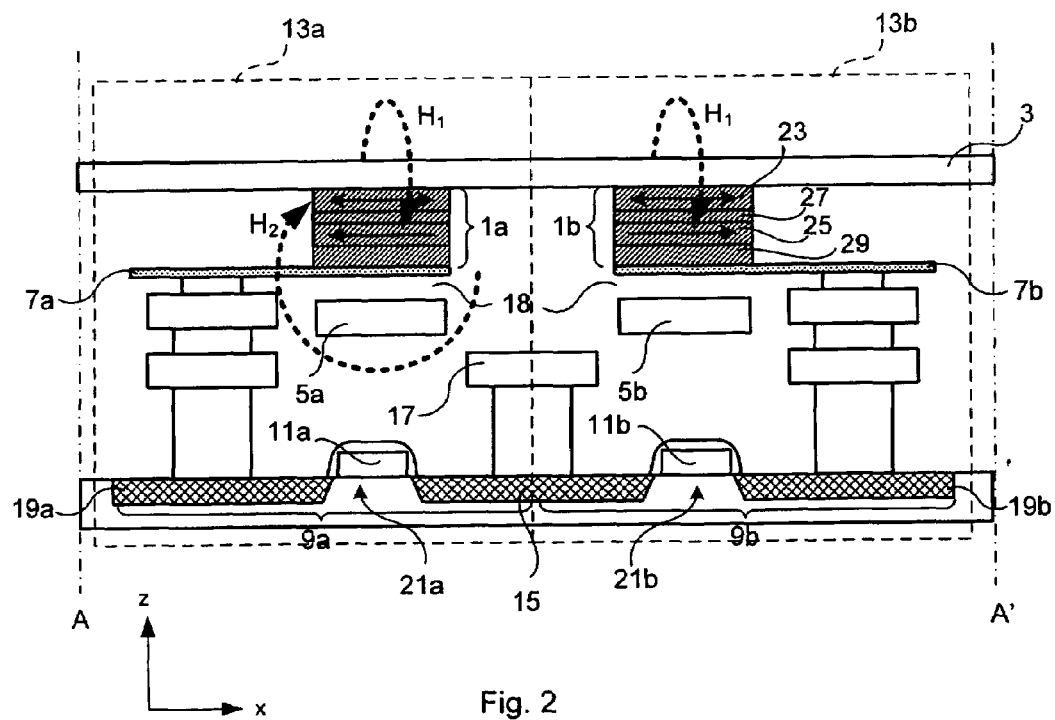
FIG. 2 is a cross-section of two neighbouring prior art MRAM cells taken along a line A-A'.

FIG. 2 is a cross-section through two neighbouring memory cells of a tow of the MRAM array, taken along the line A-A'. Each memory cell 13a, 13b is formed of one transistor 9a, 9b and one MTJ 1a, 1b. To minimise the cell area, a source 15 of each isolation transistor 9a, 9b is shared between neighbouring cells 13a, 13b. A sense line 17 is connected to the source 15 of the isolation transistor 9a, 9b.

As described above, both MTJs 1a, 1b are connected to the bit line 3. Each MTJ 1a, 1b is connected via a respective bottom electrode 7a, 7b to a drain 19a, 19b of the transistor 9a, 9b. A word line 11a, 11b is connected to a gate 21a, 21b of each transistor 9a, 9b. A digit line 5a, 5b runs underneath each MTJ 1a, 1b. The digit line 5a, 5b is separated from the bottom electrode 7a, 7b by an insulating matrix 18.

Each MTJ 1a, 1b comprises a free layer 23, a pinned layer 25, and a thin dielectric barrier 27 between the free layer 23 and the pinned layer 25. A pinning layer 29 is coupled to the pinned layer 25. The free layer 23 is a ferromagnetic layer having a relatively low coercivity. The pinned layer 25 is a ferromagnetic layer having a relatively high coercivity. The dielectric barrier 27 has a thickness such that electrons can tunnel through it. The pinning layer 29 is an antiferromagnetic layer and prevents the magnetisation of the pinned layer 25 from switching.

The dielectric barrier 27 comprises aluminium oxide ($AlO_x$) and has a thickness of about 20 Å. The free layer 23 and the pinned layer 25 are formed of nickel iron (NiFe). The pinning layer 29 can be formed of iron manganese (FeMn) or iridium manganese (IrMn).

Device Operation

Reading and writing of the prior art memory cell will now be described.

To write to the memory cell 13a, no bias is applied to the word line 11a, so that the transistor 9a is switched off. Therefore, no current can flow through the MTJ 1a. A current is then driven through the bit line 3. This generates a magnetic field $H_1$ along the magnetic hard axis of both MTJ 1a and MTJ 1b. A current is also driven through the digit line 5a. This generates a magnetic field $H_2$ along the magnetic easy axis of the MTJ 1a.

The field $H_1$ generated by the bit line 3 is about half the field required to switch the magnetisation of the free layer 23. The field $H_2$ generated by the digit line 5a is also about half the field required to switch the magnetisation of the free layer 23. The sum of the two magnetic fields $H_1$ and $H_2$ is just over the switching threshold of the free layer 23.

Therefore, the magnetic field generated around the MTJ 1b is insufficient to cause switching of the free layer 23. However, the magnetic field generated around the MTJ 1a is sufficient to cause switching of the free layer 23. In this way, only a single MTJ 1a is switched by driving current through the bit line 3 corresponding to the row of the MTJ 1a and through the digit line 5a corresponding to the column of the MTJ 1a.

The sum of the magnetic fields $H_1$ and $H_2$ is insufficient to cause switching of the pinned layer 25.

To read the memory cell 13a, a bias is applied to the word line 11a, so that the transistor 9a is switched on. Therefore, current can flow through the MTJ 1a, and current is also able to flow through all the MTJs in the same column of the array. Then, a bias is also applied to the bit line 3. Therefore, current flows through the MTJ 1a in the column defined by the word line 11a and the row defined by the bit line 3.

The magnetoresistance of the MTJ 1a depends on the direction of magnetisation of the free layer 23. When the magnetisation of the free layer 23 is arranged parallel to the magnetisation of the pinned layer 25, there is an equal density of states across the dielectric barrier 27 for spin-up and spin-down electrons. This results in a high probability of tunnelling across the battier 27, resulting in low resistance state. When the magnetisation of the free layer 23 is arranged anti-parallel to the magnetisation of the pinned layer 25, the density of states across the battier 27 is not equal for spin-up and spin-down electrons. This reduces the probability of tunnelling across the barrier 27, resulting in a high resistance state.

The resistance of the memory cell 13a is compared with an associated reference memory cell (not shown) through sense circuitry (not shown). In this way, the state of the memory cell 13a can be determined.

The size of the above-described memory cell 13a is limited by the available power. This is because, as the size of the MTJ decreases, the coercivity of the free layer 23 increases, increasing the current required through the bit lines 3 and the digit lines 5 to switch the memory cell 13a. In addition, when writing, half-selected MTJs (i.e. the MTJs in the column of the selected digit line or row of the selected bit line) have a reduced magnetic reversal energy barrier. This reduces the thermal stability of their free layers. Also, this writing method suffers from a small writing margin due to shape variations in the free layer.

As described above, STT switching MRAMs can reduce the required power for a given cell size. However, the current required for writing in the nano-second regime can be many times larger than the DC threshold current.

DETAILED DESCRIPTION OF EMBODIMENTS

First Embodiment

Device Layout

Referring to FIGS. 3A to 3D, a first embodiment of a memory array is shown. The memory array is a magnetic random access memory (MRAM).

Referring in particular to FIG. 3A, the memory array is made up of a plurality of word lines 53, defining a first dimension of the array, in this example columns of the array, and a plurality of bit lines 31, overlying and perpendicular to the word lines 53, defining a second dimension of the array, in this example rows of the array. A plurality of magnetic tunnel junctions (MTJs) 37 having stacked layers are connected to the underside of each bit line 31, in spaces between the word lines 53.

The bit lines 31 are arranged in a first direction, herein defined as the x-axis. The word lines 53 are arranged in a second direction, herein defined as the y-axis.

As shown in FIG. 3A, each MTJ 37 is formed in a pillar defined by sidewalls 38 and has an elliptical base having a short axis $L_1$ and a long axis $L_2$. In this example, the pillar has a uniform cross section up its height i.e. a uniform cross section in the x-y plane. The difference in length between the long axis $L_2$ and the short axis $L_1$ provides magnetic shape anisotropy. In this example, the ratio of the short axis $L_1$ length to the long axis $L_2$ length is 1:1.5. Therefore, each MTJ 37 has a magnetic easy axis parallel to the long axis, i.e. parallel to the x-axis, and a magnetic hard axis parallel to the short axis, i.e. parallel to the y-axis.

Figure 3B:
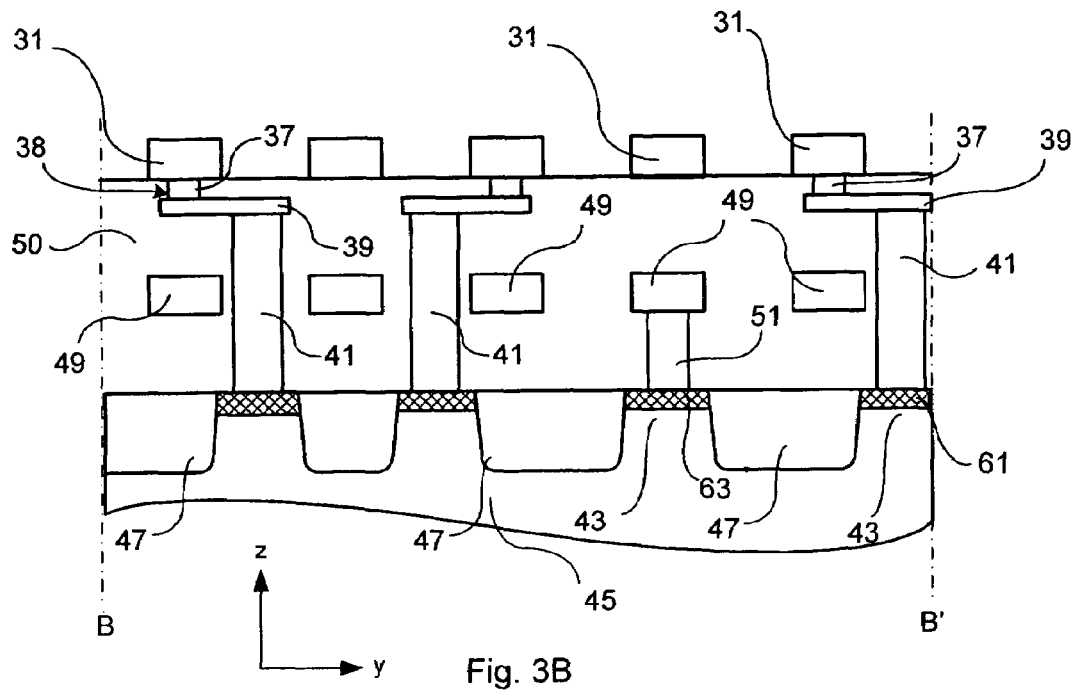
FIG. 3B is a cross section of the memory array shown in FIG. 3A taken along a line B-B'.

Referring in particular to FIG. 3B, an upper side of each MTJ 37 is connected to the underside of a bit line 31. An underside of each MTJ 37 is connected to a bottom electrode 39. A via 41 connects each bottom electrode 39 to an active region 43 in a substrate 45. The active regions 43 define areas within which diffusion of charge carriers can occur in the substrate 45.

The active regions 43 are isolated from one another in the substrate 45 by shallow trench isolation (STI) regions 47.

Figure 3C:
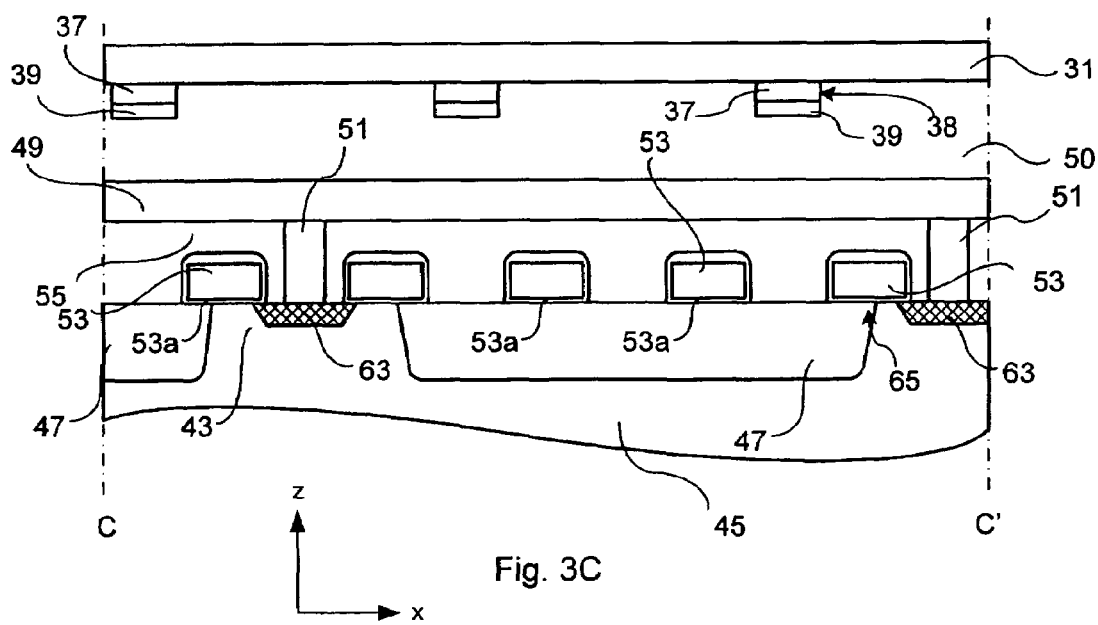
FIG. 3C is a cross section of the memory array shown in FIG. 3A taken along a line C-C'.

Referring in particular to FIG. 3C, a sense line 49 runs parallel to and underneath each bit line 31. The sense lines 49 are separated from the bit lines 31, the bottom electrodes 39, and vias 41 by an insulating matrix 50. A via 51 connects each active region 43 to the sense line 49 above it.

The word lines 53 are provided on the substrate 45 and are isolated therefrom by a gate oxide 53a. The word lines 53 are arranged perpendicular to the bit lines 31 and the sense lines 49. The word lines 53 ate separated from the sense lines 49 by an insulating matrix 55.

Referring in particular to FIG. 3A, on each row of the array, MTJs 37 are provided alternately between neighbouring pairs of the word lines 53. For example, for a first bit line $31_1$, a first MTJ $37_1$ is provided between a first word line (not shown) and a second, adjacent word line $53_2$, a second MTJ $37_2$ is provided between third and fourth word lines $53_3$, $53_4$, and a third MTJ $37_3$ is provided between fifth and sixth word lines $53_5$, $53_6$. For a second bit line $31_2$ (adjacent to the first bit line $31_1$), a fourth MTJ $37_4$ is provided between second and third words lines $53_2$, $53_3$, a fifth MTJ $37_5$ is provided between fourth and fifth bit lines $53_4$, $53_5$ and a sixth MTJ $37_6$ is provided between a sixth word line $53_6$ and a seventh, adjacent word line (not shown). Neighbouring MTJs 37 on each bit line 31 are arranged into pairs 59.

Figure 3D:
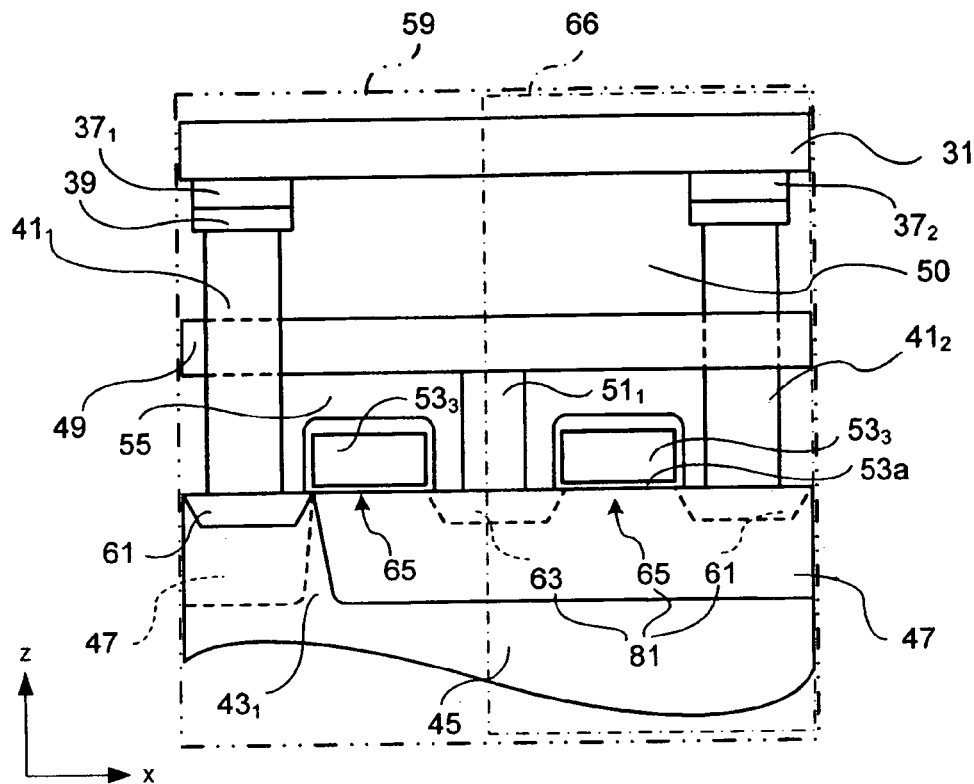
FIG. 3D is a side view of part of the memory array shown in FIG. 3A.

Referring in particular to FIG. 3D, each pair of MTJs 59 has an active region $43_1$ running between the respective vias $41_1$, $41_2$ of two MTJs 37a, 37b. STI regions 47 separate the active region $43_1$ for each pair 59. The via $51_1$ connecting the active region $43_1$ to the sense line 49 is provided between the word lines $53_2$, $53_3$ that are in area defined by the pair 59.

Referring still to FIG. 3D, a source region 61 is provided in the active region 43 below each via 41 connecting the bottom electrode 39 to the active region 43. A drain region 63 is provided in the active region 43 below each via 51 connecting the sense line 49 to the active region 43. Therefore, each active region 43 provides two source regions 61 and one drain region 63. Conduction between each source region 61 and the drain region 63 occurs through the word line 53 between said regions. Therefore, said word line 53 serves as a gate 65 of an isolation transistor 81, and one isolation transistor 81 is provided for each MTJ 37.

Referring to FIG. 3A and FIG. 3D, a memory cell 66 is defined by one MTs 37 and a respective transistor. The drain region 63 of the transistor is shared between neighbouring memory cells 66. The memory cell 66 has an area 8 $F^2$. The feature size F of the memory array may be 100 nm or less.

The bit line 31 is made of a conductive material, such as copper or tungsten.

Figure 4:
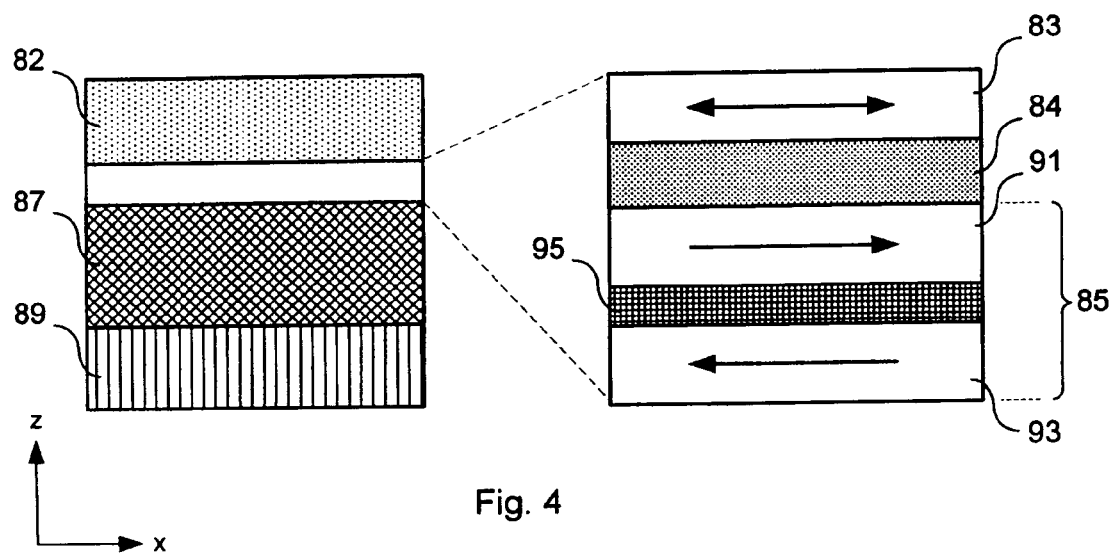
FIG. 4 is a cross section of a magnetic tunnel junction used in the memory array shown in FIG. 3A.

Referring to FIG. 4, the layer structure of the MTJ 37 is shown.

The MTJ 37 comprises a sequence of layers, including a capping layer 82, a free layer 83, a tunnel barrier layer 84, a pinned layer 85, a pinning layer 87, and a buffer layer 89. In this example, the capping layer 82 is furthest from the substrate 45 and the buffer layer 89 is closest to the substrate 45.

The free layer 83 is formed of a fetromagnetic material. The free layer 83 has a relatively low coercivity, so that it can be switched on application of a switching current or magnetic field.

The tunnel barrier layer 84 is formed of an insulating material, such as magnesium oxide (MgO), and is sufficiently thin that electrons can tunnel through it.

The pinned layer 85 is a synthetic antiferromagnet (SAF). The SAF 85 comprises a first ferromagnetic sub-layer 91, having a first magnetisation, and a second ferromagnetic sub-layer 93, having a second magnetisation, separated by an antiferromagnetic layer 95. The first magnetisation and the second magnetisation are unequal in magnitude, and are anti-parallel to one another. In this example, the second ferromagnetic sub-layer 93 is a thicker than the first ferromagnetic sub-layer 91, therefore the second magnetisation has a larger magnitude than the first magnetisation.

The antiferromagnetic layer 95 couples the first ferromagnetic sub-layer 91 and the second ferromagnetic sub-layer 93. The first magnetisation and the second magnetisation are aligned parallel to the easy axis of the MTJ 37 i.e. parallel to the x-axis. Therefore, the SAF has a small net magnetisation in the x-direction. The pinned layer 85 has a relatively high coercivity.

The pinning layer 87 comprises an antiferromagnetic material. The pinning layer 87 pins the magnetisation of the pinned layer 85, to prevent the magnetisation of the pinned layer 85 from switching on application of a magnetic field or a switching current.

When the magnetisation of the free layer 83 is parallel to the magnetisation of the first ferromagnetic sub-layer 91 of the pinned layer 85, the MTJ 37 has a relatively low magnetoresistance. When the magnetisation of the free layer 83 is anti-parallel to the magnetisation of the first ferromagnetic sub-layer 91 of the pinned layer 85, the MTJ 37 has a relatively high magnetoresistance.

In this example, the capping layer 82 is formed of a non-magnetic metal, for example copper (Cu) or tantalum (Ta), and has a thickness of about 10 nm. In another example, the capping layer 82 may be formed of two layers of tantalum each having a thickness of 5 nm separated by a layer of copper having a thickness of 10 nm i.e. Ta(5 nm)/Cu(10 nm)/Ta(5 nm).

In this example, the free layer 83 is formed of cobalt iron boron (CoFeB) and has a thickness of about 3 nm.

In this example, the tunnel barrier layer 84 is formed of magnesium oxide (MgO). However, other dielectric materials, such as aluminium oxide ($AlO_x$), silicon dioxide ($SiO_2$), and aluminium nitride (AlN), can be used. In this example, the tunnel barrier layer 84 has a thickness of 2 nm. In other examples, the thickness of the tunnel barrier layer 84 can be in the range 1 nm to 2 nm.

The first ferromagnetic sub-layer 91 is formed of cobalt iron boron (CoFeB) and has a thickness of about 4 nm. The coupling layer 95 is formed of rubidium (Ru) and has a thickness of about 0.8 nm. The second ferromagnetic sub-layer 93 is formed of cobalt iron (CoFe) and has a thickness of about 6 nm.

In this example, the pinning layer comprises platinum manganese (PtMn) and has a thickness of about 15 nm. PtMn is preferred because it has a high blocking temperature and a high exchange biasing field, which improve the thermal stability of the MTJ 37. However, other antiferromagnetic materials such as iridium manganese (IrMn), nickel manganese (NiMn) and palladium manganese (PdMn) can be used.

The buffer layer 89 is formed of at least one non-magnetic conductive layer and has a thickness between 10 nm and 20 nm. For example, the buffer layer 89 can be formed of two layers of tantalum each having a thickness of 5 nm separated by a layer of copper having a thickness of 10 nm, and an overlying layer of nickel-iron having a thickness of 5 nm separated from the copper layer by one of the tantalum layers i.e. Ta(5 nm)/Cu(10 nm)/Ta(5 nm)/NiFe(5 nm). Alternatively, the two tantalum layers may be separated by a gold layer having a thickness of 10 nm i.e. Ta(5 nm)/Au(10 nm)/Ta(5 nm)/NiFe(5 nm). In another example, the buffer layer 89 may be formed of a layer of tantalum having a thickness of 5 nm and a layer of nickel-iron having a thickness of 5 nm i.e. Ta(5 nm)/NiFe(5 nm). In the above examples, the nickel-iron layer is a seed layer for the pinning layer 87.

The long and short axes of the elliptical cross section of the MTJ 37 in the x-y plane have dimensions 99 nm and 66 nm respectively.

The ratio of magnetoresistance for the relatively high resistance state and the relatively low resistance state can approach 3:1 for the above-described MTJ 37. This can provide an MRAM having a high signal to noise ratio.

Figure 5:
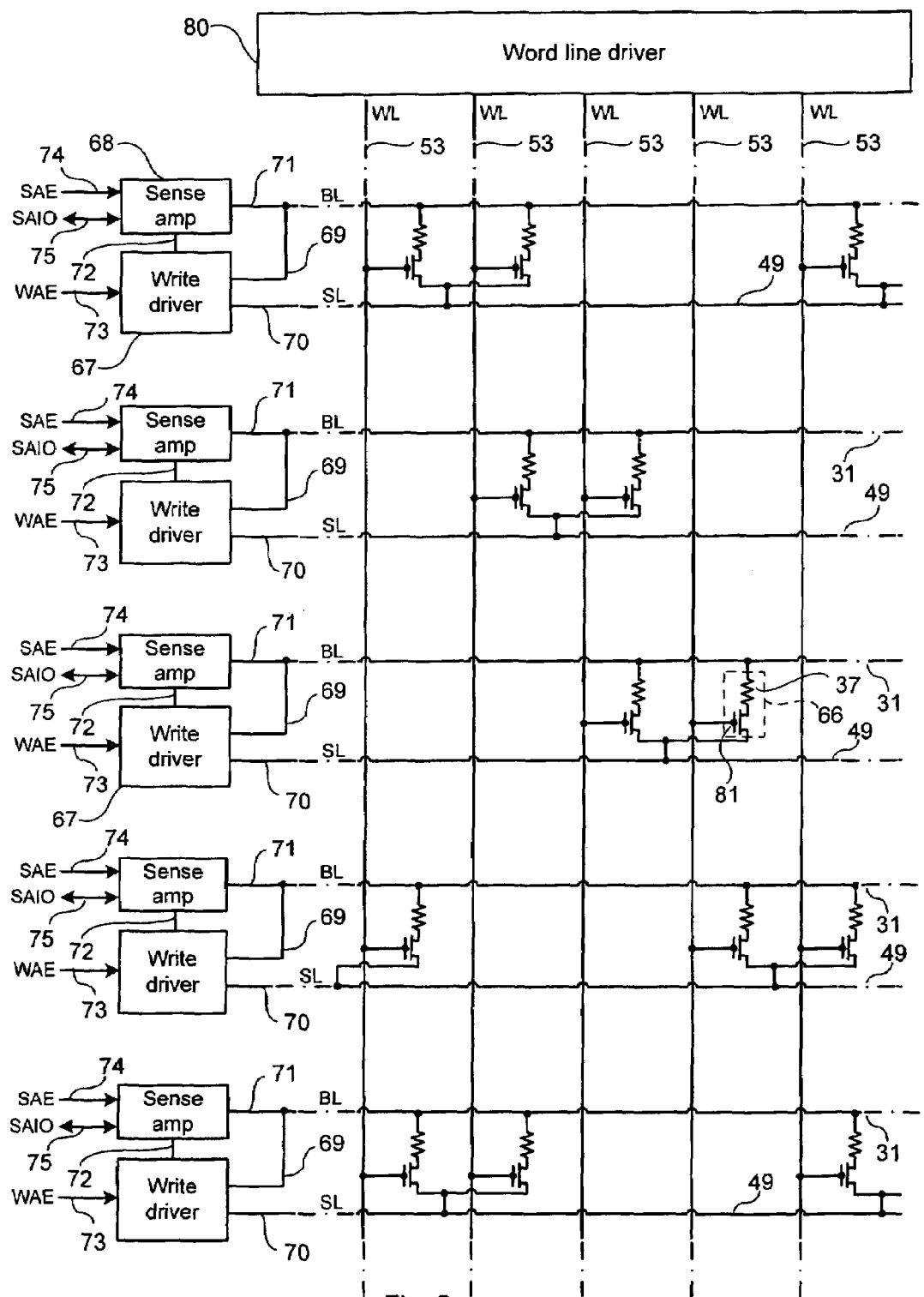
FIG. 5 illustrates control circuitry for the memory array shown in FIG. 3A.

Referring to FIG. 5, control circuitry for the memory array is shown.

A write driver 67 and a sense amplifier 68 ate provided for each tow of the memory array. Each bit line 31 is connected to a first output 69 of a respective write driver 67. Each sense line 49 is connected to a second output 70 of the respective write driver 67. Each bit line 31 is also connected to a first input/output port 71 of the respective sense amplifier 68.

A connection 72 is provided between a second output of the sense amplifier 68 and a first input of the respective write driver 67.

The write driver 67 has a second input 73 for applying a write amplifier enable (WAE) voltage.

The sense amplifier 68 has a second input 74 for receiving a sense amplifier enable (SAE) voltage. The sense amplifier 68 has a third input/output port 75 for applying a sense amplifier input/output (SAIO) voltage.

A single word line driver 80 is provided. Each word line 53 is connected to a respective output of word line driver 80.

Each MTJ 37 connects a bit line 31 to the sense line 49 in the same tow, through a single isolation transistor 81. The base of the isolation transistor 81 is connected to a single word line 53. Current will flow through the MTJ 37 when a bias is applied to the word line 53 defining the column of the MTJ 37, and a bias is applied to the bit line 31 or sense line 49 defining the row of the MTJ 37. In this way, each MTJ 37 is addressable by a single word line 53 and a single bit line 31 or sense line 49.

Device Operation

Figure 6:
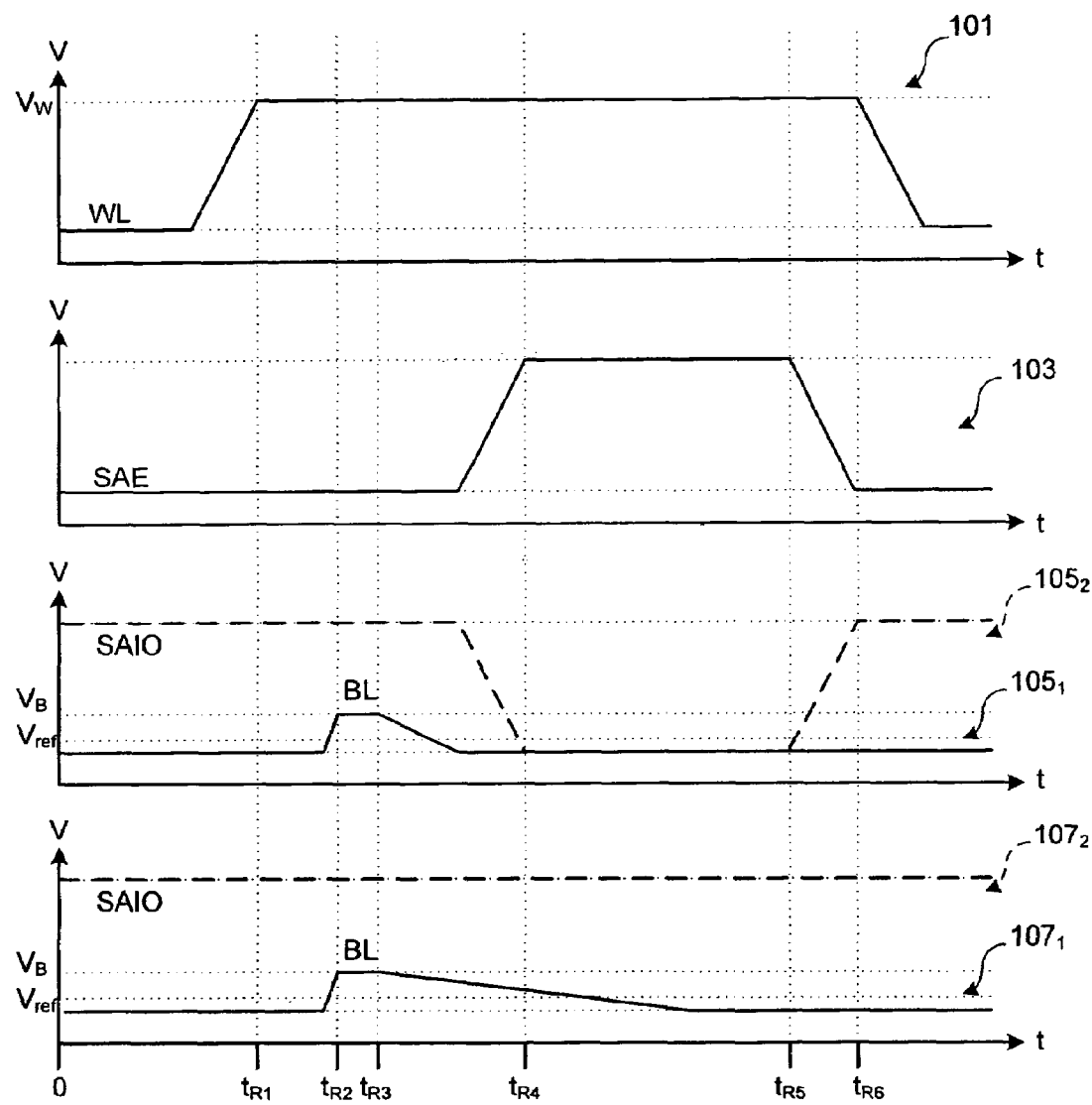
FIG. 6 illustrates biases which are applied to the memory array shown in FIG. 3A during a read cycle.

Referring to FIGS. 4, 5 and 6, reading and writing of a memory cell 66 in the memory array will now be described.

FIG. 6 illustrates biases which are applied to and measured in the memory array during a read cycle.

A first plot 101 is of a word line bias against time. A second plot 103 is of a sense amplifier enable (SAE) bias applied to the second input 74 of the sense amplifier 68 against time. A third plot $105_1$ and a fourth plot $105_2$ are of the voltage response on the bit line 31 against time and the sense amplifier input/output (SAIO) bias against time respectively, when the magnetisation of the free layer 83 and the magnetisation of the pinned layer 85 are parallel. A fifth plot $107_1$ and a sixth plot $107_2$ are of the voltage response on the bit line 31 against time and the SAIO bias against time respectively, when the magnetisation of the free layer 83 and the magnetisation of the pinned layer 85 are antiparallel.

As shown in the first plot 101, at a time $t_{R1}$ a bias $V_W$ is applied by the word line driver 80 to the word line (WL) 53 corresponding to the column of the memory cell 66. $V_W$ may be in the range 1 V to 3 V. This opens the isolation transistors 81 in the column of the array.

As shown in the third plot 1051 and the fifth plot $107_1$, at a time $t_{R2}$ a bias $V_B$ is applied by the write driver 67 to the bit line (BL) 31 corresponding to the row of the memory cell. In this example, $V_B$ is about 0.4 V. The sense line (SL) 49 corresponding to the row of the memory cell is held a ground. At time $t_{R3}$, the bias $V_B$ is removed.

As shown in the third plot $105_1$, in this example the voltage response on the bit line 31 decreases to ground in about 1 ns. This is because, when the magnetisation of the free layer 83 and the magnetisation of the pinned layer 85 ate parallel, the magnetoresistance of the MTJ 37 (and thus the measured voltage response) is relatively low, thus the voltage response is relatively fast.

As shown in the fifth plot 107, in this example the voltage response on the bit line 31 decreases to ground in about 2 to 3 ns. This is because, when the magnetisation of the free layer 83 and the magnetisation of the pinned layer 85 are anti-parallel, the magnetoresistance of the MTJ 37 (and thus the measured voltage response) is relatively high, thus the voltage response is relatively slow.

As shown in the second plot 103, at a later time $t_{R4}$, the SAE bias is applied the sense amplifier 68 that corresponds to the row of the memory cell 66. When the sense amplifier 68 is enabled, it senses whether the voltage response on the bit line 31 is below a reference voltage $V_{ref}$. $V_{ref}$ may be about half $V_B$. In this example, $V_{ref}$ is 0.2 V.

As shown in the third plot $105_1$, when the magnetisation of the free layer 83 and the magnetisation of the pinned layer 85 are parallel, by time $t_{R4}$ the voltage response on the bit line 31 has dropped below $V_{ref}$. This is sensed by the sense amplifier 68. Therefore, the sense amplifier input/output (SAIO) at the third input/output port 75 of the sense amplifier 68 is set to be low.

As shown in the fifth plot $107_2$, when the free layer 83 and the pinned layer 85 are antiparallel, by time $t_{R4}$ the voltage response on the bit line 31 has not dropped below $V_{ref}$. This is sensed by the sense amplifier 68. Therefore, the SAIO at the third input/output port 75 of the sense amplifier 68 is set to be high.

At time $t_{R5}$, the SAE bias is removed. At time $t_{R6}$, the WL bias is removed.

In this example, $t_{R1}$ is 1 ns, $t_{R2}$ is 2.5 ns, $t_{R3}$ is 3.5 ns, $t_{R4}$ is 7.5 ns, $t_{R5}$ is 9 ns, and $t_{R6}$ is 10 ns.

In this way, the direction of magnetisation of the free layer 83 determines the output of the third input/output port of the sense amplifier 68. If the free layer 83 is parallel to the pinned layer 85, the output of the sense amplifier 68 is '0'. If the free layer 83 is anti-parallel to the pinned layer 85, the output of the sense amplifier 68 is '1'.

Figure 7:
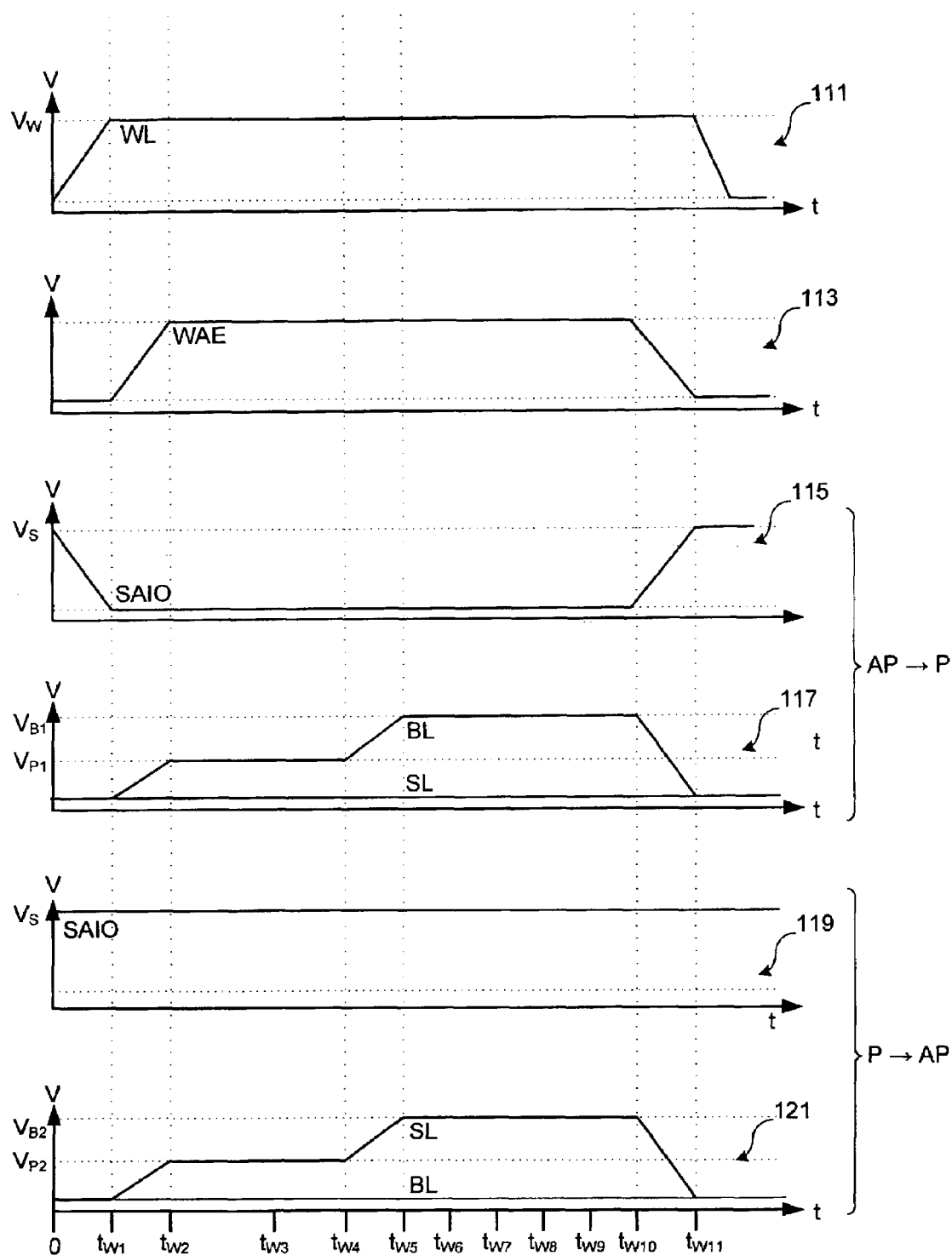
FIG. 7 illustrates biases which are applied to the memory array shown in FIG. 3A during a write cycle in accordance certain embodiments of with the present invention.

FIG. 7 illustrates biases which are applied to the memory array during a write cycle in accordance with the present invention.

A seventh plot 111 is of a word line (WL) bias against time. An eight plot 113 is of a write amplifier enable (WAE) bias against time. A ninth plot 115 and a tenth plot 117 are of an SAIO bias applied to the memory cell 66 against time and of biases applied to the bit line (BL) and sense line (SL) against time respectively, when the magnetisation of the free layer 83 switches from anti-parallel to the magnetisation of the pinned layer 85 to parallel to the magnetisation of the pinned layer 85 (AP to P switching). An eleventh plot 119 and a twelfth plot 121 are of an SAIO bias applied to the memory cell 66 against time and of biases applied to the bit line (BL) and sense line (SL) against time respectively, when the magnetisation of the free layer 83 switches from parallel to the magnetisation of the pinned layer 85 to anti-parallel to the magnetisation of the pinned layer 85 (P to AP switching).

Referring to the seventh plot 111, to write data to the memory cell 66, at time $t_{W1}$ the WL bias $V_W$ is applied by the word line driver 80 to the word line 53 that corresponds to the column of the memory cell 66. $V_W$ may be in the range 1V to 3V. This opens the isolation transistors 81 in the column of the array.

At time $t_{W1}$, the SAIO bias is applied to the third input/output port 75 of the sense amplifier 68 corresponding to the row of the memory cell 66. As shown in the ninth plot 115, for AP to P switching the SAIO bias is held at ground. As shown in the eleventh plot 119, for P to AP switching the SAIO bias is held at $V_S$. The connection 72 transmits this signal from the second output of the sense amplifier 68 to the first input of the write driver 67.

Referring to the eighth plot 113, at time $t_{W2}$ the WAE bias is applied to the write driver 67 corresponding to the row of the memory cell 66. This enables the write driver 67 to apply a bias to either the bit line 31 or the sense line 49, depending on the output SAIO of the sense amplifier 68.

Referring to the tenth plot 117, when SAIO is held at ground, at time $t_{W2}$ the write driver 67 applies a pre-charging bias $V_{P1}$ to the bit line 31, and the sense line 49 is held at ground. Therefore, the write driver 67 drives current from the sense line 49 to the bit line 31. $V_{P1}$ may be between 0.5 to 1 times $R_1$-$I_{c0}$, where $R_1$ is the resistance of the MTJ 37 in the AP state, and $I_{c0}$ is the DC threshold current.

At time $t_{W4}$, the bias applied to the bit line 31 is increased to $V_{B1}$. $V_{B1}$ is large enough to cause STT switching. A value of $V_{B1}$ can be found by routine experimentation. Typically, $V_{B1}$ is between 0.3 and 0.5 of the bias required to cause STT switching for the same pulse duration when no pre-charging bias $V_{P1}$ is applied.

Referring to the twelfth plot 121, when SAIO is held at $V_S$, at time $t_{W2}$ the write driver 67 applies a pre-charging bias $V_{P2}$ to the sense line 49, and the bit line 31 is held at ground. Therefore, the write driver 67 drives current from the bit line 31 to the sense line 49. $V_{P2}$ is may be between 0.5 to 1 times $R_2$-$I_{c0}$, where $R_2$ is the resistance of the MTJ 37 in the P state, and $I_{c0}$ is the DC threshold current.

At time $t_{W10}$, the bias applied to the bit line 31 is increased to $V_{B2}$. $V_{B2}$ is large enough to cause STT switching. A value of $V_{B2}$ can be found by routine experimentation. Typically, $V_{B2}$ is between 0.3 and 0.5 of the bias required to cause STT switching for the same pulse duration when no pre-charging bias $V_{P2}$ is applied.

At time $t_{W10}$, the BL or SL bias is removed. At time $t_{W11}$, the WL bias is removed.

Preferably, $t_{W1}$ is 1 ns, $t_{W2}$ is 2 ns, $t_{W3}$ is 3.535 ns, $t_{W4}$ is 4 ns, $t_{W5}$ is 4.2 ns, $t_{W6}$ is 4.23 ns, and $t_{W7}$ is 4.885 ns, $t_{W8}$ is 5.07 ns, $t_{W9}$ is 5.285 ns, $t_{W10}$ is 5.7 ns and $t_{W11}$ is 5.9 ns.

Figure 8:
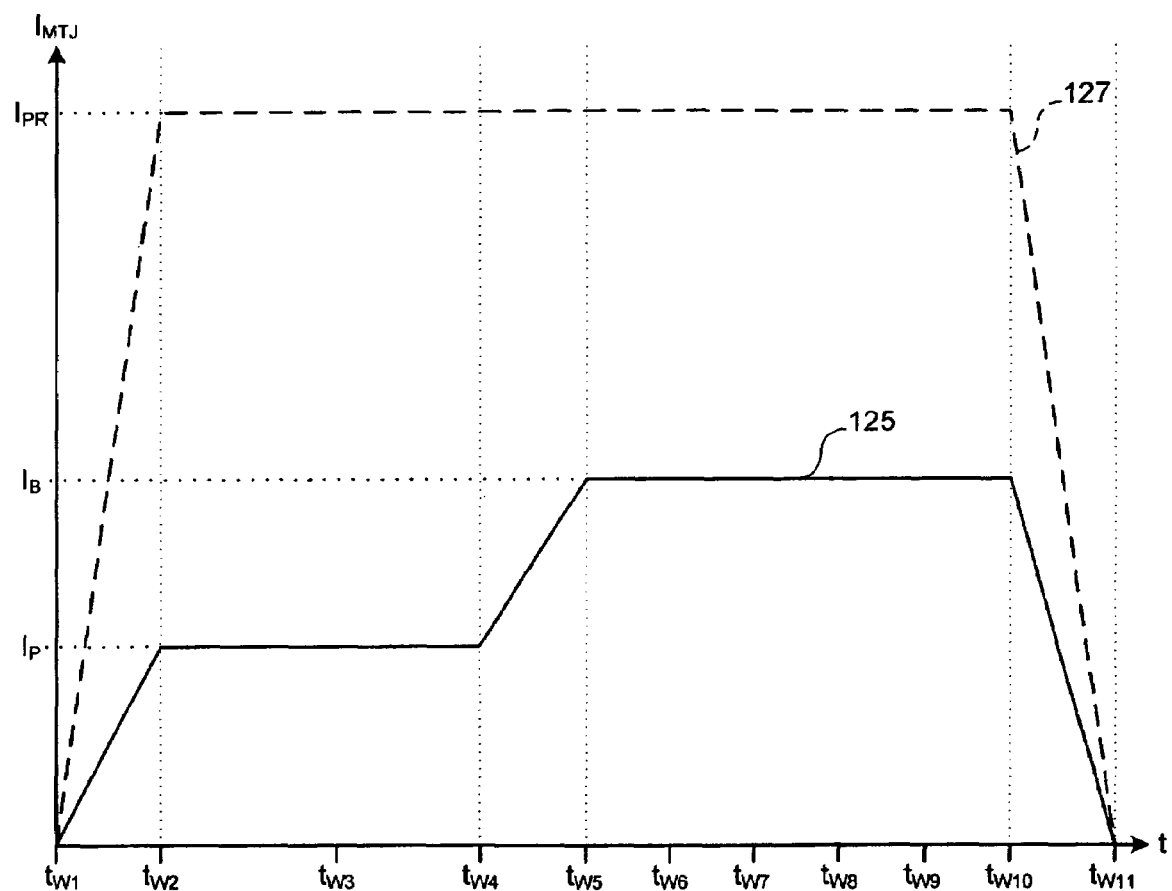
FIGS. 8 illustrates current through the memory array shown in FIG. 3A during a write cycle.

FIG. 8 is a twelfth plot 125 of current $I_{MTJ}$ through the MTJ 37 at times during the write cycle for P to AP switching. A thirteenth plot 127 of current used in prior art writing cycles is shown for comparison.

Figure 9B:
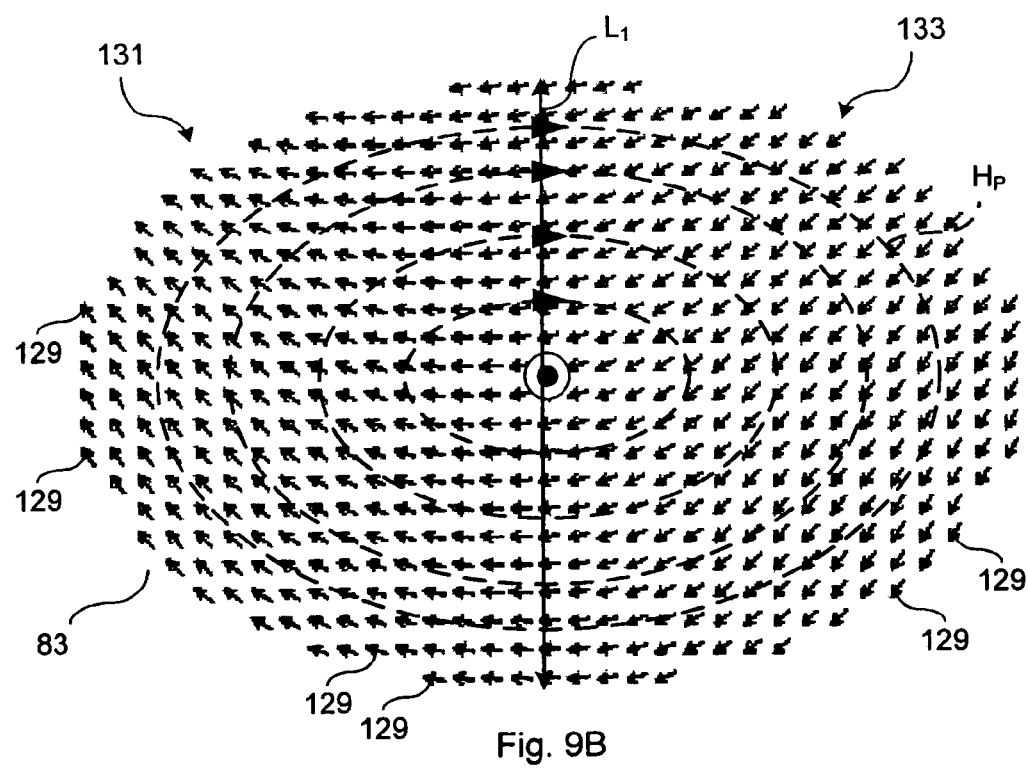
Figure 9C:
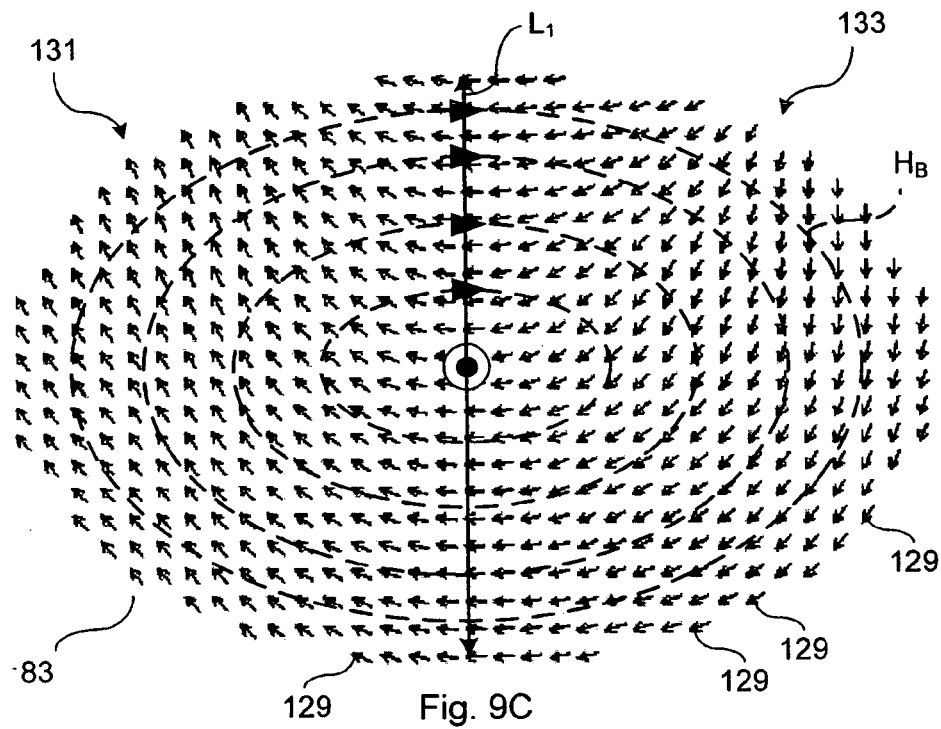
Figure 9D:
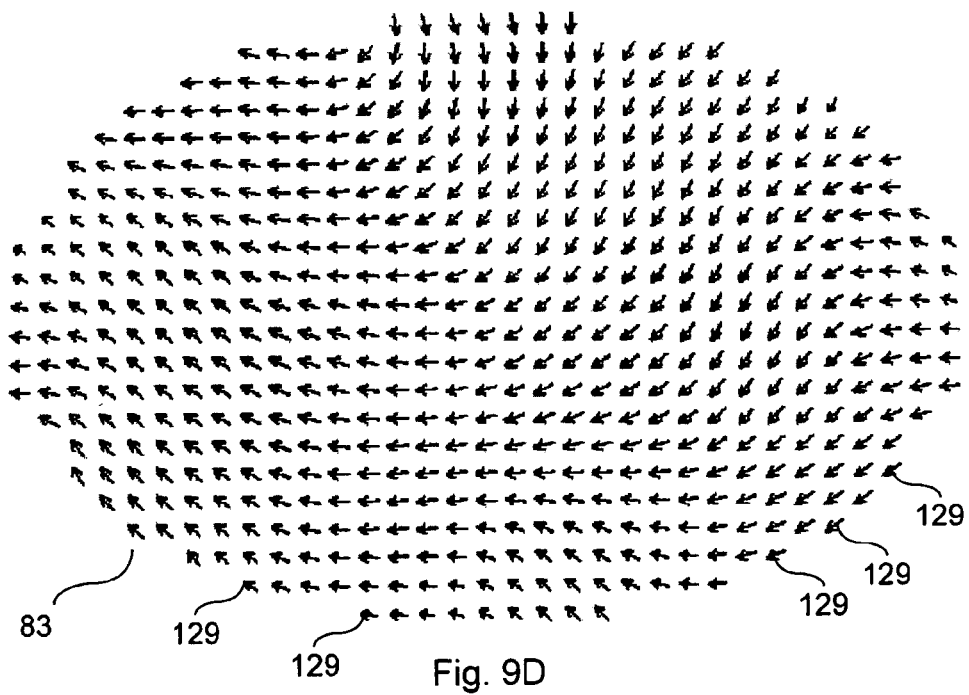
Figure 9E:
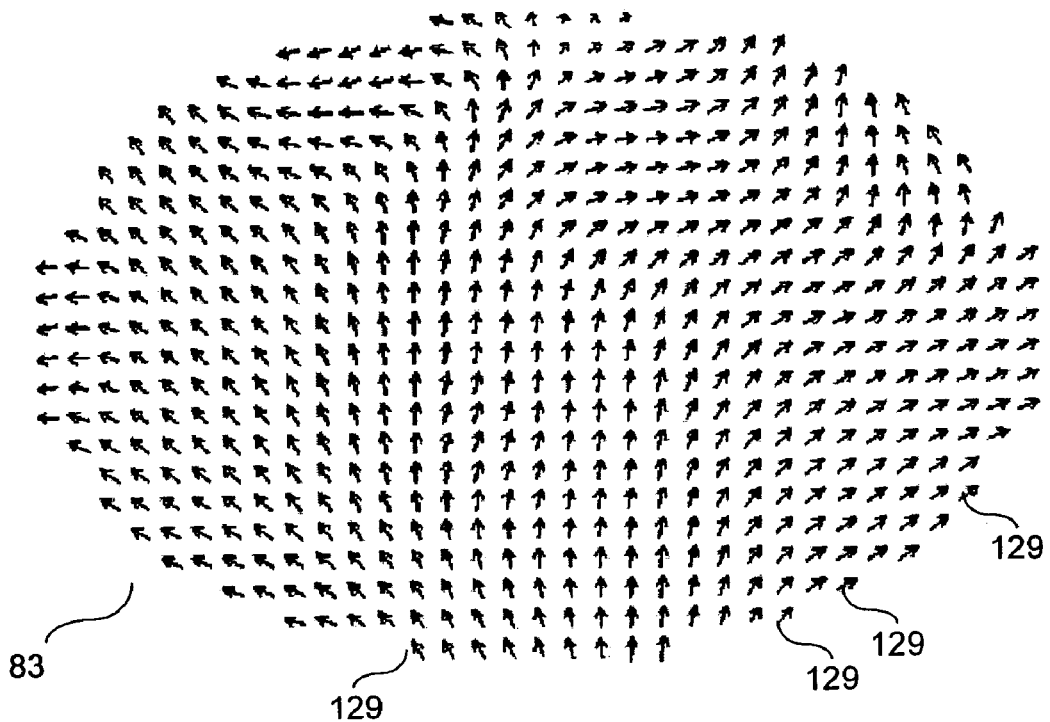
Figure 9F:
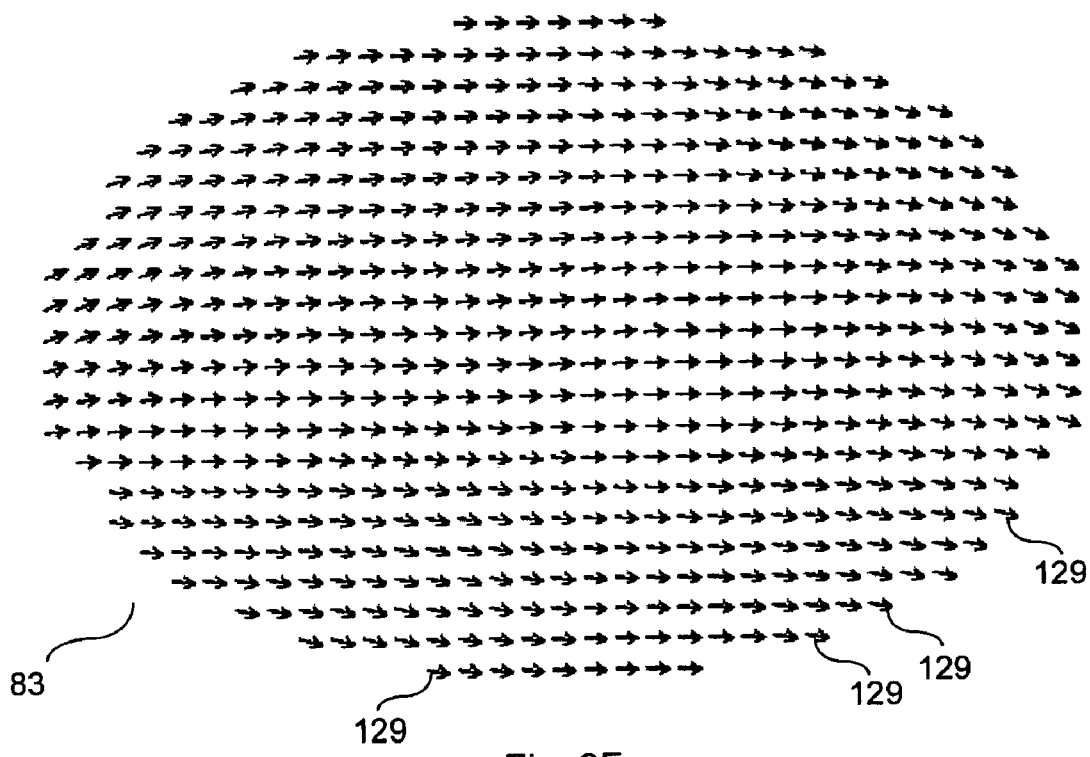

Referring to FIGS. 9A and 9F, a simulation of magnetisations within the free layer 83 during the writing cycle for P to AP switching is shown. In FIGS. 9A to 9F, representative magnetisations 129 in 3 nm×3 nm sections of the free layer 83 are plotted.

Referring to FIG. 8 and FIG. 9A, at time $t_{W1}$, the current $I_{MTJ}$ is zero and the free layer 83 has an initial magnetisation configuration, in which the magnetisations 129 are all aligned in the same direction, and are parallel to the magnetisations of the pinned layer 85 (FIG. 4).

Referring to FIG. 4 and FIG. 8, at time $t_{W2}$ a pre-charging current $I_P$ is driven from the sense line 49 (FIG. 5) to the bit line 31 (FIG. 5). Therefore, current flows from the pinned layer 85 to the free layer 83, perpendicular to the plane of the pinned layer 85 and the free layer 83, and electrons flow from the free layer 83 to the pinned layer 85. This causes spin-polarised electrons to be scattered back from the pinned layer 85 and injected in to the free layer 83.

The current $I_P$ is equal to the DC threshold current for STT switching. In this example, the DC threshold current is about 1 mA. As described above, in the nanosecond regime the required current to cause STT switching is much larger than the DC threshold current. Therefore, $I_P$ is not large enough to cause STT switching. However, the current $I_P$ induces an Ampere field in the free layer 83.

Referring to FIG. 9B, at time $t_{W3}$ the Ampere field $H_P$ in the free layer 83 results in a first intermediate magnetisation configuration. The Ampere field $H_P$ induces C-like bending of the magnetisations 129 in the free layer 83, resulting in a C-like domain structure. In the C-like domain structure, the magnetisations 129 along the short axis $L_1$ of the free layer 83 remain parallel to their direction in the initial magnetisation configuration. The magnetisations 129 on a first side 131, defined to be the left side, of the short axis $L_1$ rotate clockwise, rotating by a larger amount further from the centre line. The magnetisations 129 on a second side 133, defined to be the right side, of the short axis $L_1$ rotate anticlockwise, also rotating by a larger amount further from the short axis $L_1$. This results in the magnetisations 129 aligning in a 'C' shape.

The C-like domain structure excites magnetisation precession in the free layer 83. Therefore, the magnetisations 129 of the free layer 83 oscillates between those in the initial magnetisation configuration, for example as shown in FIG. 9A, and the magnetisations 129 of the free layer in the first intermediate magnetisation configuration, for example as shown in FIG. 9B. The frequency of the oscillations is of the order 1 GHz.

Referring to FIG. 8, at time $t_{W4}$, the current $I_{MTJ}$ is increased, and the current reaches $I_B$ at time $t_{W5}$. In this example $I_B$ is 3 mA.

Referring to FIG. 9C, a second intermediate magnetisation configuration at time $t_{W6}$ is shown. The increased Ampere field $H_B$ has amplified the C-like bending, and the magnetisations 129 on the left side 131 are rotated further clockwise, while the magnetisations 129 on the right side 133 are rotated further anticlockwise. At time $t_{W5}$, the magnetisations 129 of the free layer 83 are still oscillating between the magnetisations 129 shown in FIG. 9C and the magnetisations 129 shown in FIG. 9A.

Referring to FIG. 9D, a third intermediate magnetisation configuration at time $t_{W7}$ is shown. The symmetry of the C-like domain structure is broken down.

Referring to FIG. 9E, a fourth intermediate magnetisation configuration at time $t_{W8}$ is shown. The C-like bending structure is no longer present, and instead there is a more complicated domain structure. The net magnetisation of the entire free layer 83 has rotated anticlockwise from the initial magnetisation configuration, for example as shown in FIG. 9A.

Referring to FIG. 9F, a final magnetisation configuration at time $t_{W9}$ is shown. The majority of the magnetisations 129 are aligned antiparallel to those in the initial magnetisation configuration i.e. antiparallel to the pinned layer 85. At time $t_{W8}$, the magnetisations 129 of the free layer 83 are no longer oscillating.

Between time $t_{W9}$ and time $t_{W10}$, the current $I_{MTJ}$ is ramped down to zero.

For AP to P switching, the same current pulse is applied, however the current flows in the opposite direction. Therefore, current flows from the free layer 83 to the pinned layer 85. This causes electrons to flow from the pinned layer 85 to the free layer 83. Electrons driven through the pinned layer 85 are spin-polarised and are injected into the free layer 83.

In AP to P switching, lower currents can be applied. This is because driving electrons through the pinned layer 85 and injecting them directly into the free layer 83 is more efficient than scattering electrons from the pinned layer 85 and then injecting them into the free layer 83. For AP to P switching, in this example, $I_P$ is 0.4 mA, and $I_B$ is 1.2 mA.

Referring to FIG. 8, a typical prior art writing cycle involves ramping a current 127 to a value $I_{PR}$, holding the current at this value for a given duration, and then ramping the current 127 down to zero. As shown in FIG. 8, the current $I_B$ required to cause STT switching when a pre-charging current is applied, is much less than the current $I_{PR}$ required for a uniform current pulse 127. This is because the C-like domain structure excites the magnetisation precession in the free layer 83. The current $I_B$ required to cause STT switching using the above-described method can be as low as 30% to 40% of the current $I_{PR}$ required to cause STT switching using a uniform current pulse.

Referring to FIGS. 10A and 10B, respective simulation results for STT switching with and without a pre-charging current are shown. The simulation is of STT switching at a temperature of 0 K. The simulation results show normalised current $I/I_{c0}-1$ requited for STT switching against the inverse of the pulse duration $t_P^{-1}$.

Referring in particular to FIG. 10A, for AP to P switching a switching current 129 for a given pulse duration when a pre-charging current pulse of duration 2 ns and magnitude of the DC threshold is passed through an MTJ can be up to 30% less than a switching current 131 when no pre-charging current pulse is used.

Referring in particular to FIG. 10B, for P to AP switching a switching current 133 for a given pulse duration when a pre-charging current pulse of duration 2 ns and magnitude of the DC threshold is passed through an MTJ can also be up to 30% less than a switching current 135 required when no pre-charging current pulse is used.

In addition, using a pre-charging current significantly reduces the probability distribution in the nanosecond regime. Therefore, the writing current margin in MRAMs can be enlarged.

Device Fabrication

Referring to FIGS. 11A to 11G, a method of fabricating the memory array shown in FIGS. 3A to 3D will be described. FIGS. 11A, 11C, 11E and 11G show a cross section of the memory array shown in FIG. 3A taken along line B-B' during stages of the fabrication process. FIGS. 11B, 11D, 11F and 11H show a cross section of the FIG. 3A memory array taken along line C-C' during stages of the fabrication process.

Referring firstly to FIGS. 11A and 11B, an STI etch process is used to create shallow trenches 47 in the silicon substrate 45, which are filled with dielectric material. Areas of the substrate that do not comprise the STI regions define the active regions 43.

Gate insulating layers 53a and word lines 53 are sequentially stacked to form gate stacks on the substrate and STI regions. Gate spacers 53b are formed on the sidewalls and on top of the gate stack. Impurity ions are implanted into the substrate 45 to form source region 61 and drain regions 63 for isolation transistors.

Referring now to FIGS. 11C and 11D, a first insulating matrix 55 is formed on the entire surface of the substrate. The first insulating matrix 55 is successively patterned and etched to open vias 51 that expose a portion of each drain region 63. One or more conductive layers are then formed on the substrate and fill the vias 51. The upper portion of the conductive layer is then removed, typically using a planarisation process, to remove all of the conductive layer except that formed in the vias 51, and expose a top surface of the first insulating matrix 55.

Another conductive layer is then formed on the first insulating matrix 55. The conductive layer is patterned then etched to form sense lines 49 running perpendicular to the word lines and contacting the conductive layer in the via 51. A second insulating matrix 50 is then formed on the structure. In a similar fashion as described above with respect to vias 51, vias 41 are formed in the first insulating matrix and the second insulating matrix to contact the surface of each source region 61.

Referring now to FIGS. 11E and 11F, a conductive layer is formed on the substrate. The conductive layer is then patterned and etched to form bottom electrodes 39 contacting vias 41.

The MTJs 37 are then fabricated according to the following steps.

The buffer layer 89 and the antiferromagnetic pinning layer 87 are deposited in series. The magnetisation of the pinning layer 87 is set by heating it and applying an external magnetic field to it, which is maintained as the pinning layer 87 cools. The first ferromagnetic sub layer 91, antiferromagnetic coupling layer 95 and second ferromagnetic sub-layer 93 are then deposited in series over the pinning layer 87.

The barrier material is then deposited. The can be achieved by r-f sputtering the material, or depositing magnesium and then oxidising the magnesium by a process such as plasma oxidation.

The ferromagnetic free layer 83 is then deposited. The capping layer 82 is deposited on the ferromagnetic free layer 83.

The resulting stack is then patterned into cells to form the MTJs 37. Patterning may be performed by depositing a layer of photoresist on the protective capping layer, using photolithography to pattern the photoresist, and removing the unprotected material.

Referring now to FIGS. 11G and 11H, a third insulating matrix 123 is then formed over the upper surface of the substrate including the MTJ 37. The third insulating matrix 123 is patterned to form a bit line contact holes 125 that exposes the surfaces of the capping layers 82. A conductive layer is then formed on the substrate and in bit line contact holes 125. The conductive layer is then patterned and etched to form bit lines 31 that cover the bit line contact holes 125, and are parallel to the sense lines 49.

In the above-described fabrication process, the conductive layers can be formed using a method well known in the art such as chemical vapour deposition, physical vapour deposition, plasma enhanced chemical vapour deposition, or sputtering.

Second Embodiment

Device Layout

Referring to FIGS. 12A to 12C, a second embodiment of a memory array is shown. The memory array is an MRAM.

Referring in particular to FIG. 12A, a plurality of bit lines 201 are arranged in a first direction, herein defined as the x-axis. The bit lines 201 define a first dimension of the array, in this example rows of the array.

A plurality of MTJs 207 are provided. The MTJs 207 have the same structure as the MTJs 37 described above with respect the first embodiment. The MTJs 207 are arranged with the magnetic easy axis parallel to the bit lines 201, i.e. parallel to the x-axis.

Referring in particular to FIG. 12B, Each MTJ 207 is connected to the underside of a bit line 201. Thus, the MTJs 207 are electrically isolated from the assist current lines 203.

Referring in particular to FIG. 12A, each MTJ is connected to a bottom electrode 209. The bottom electrode 209 is a rectangle in the x-y plane having long and short sides. The long and short sides of the bottom electrode 209 are approximately the same size as the long and short axes of the MTJ 207.

Referring in particular to FIG. 12B, a via 211 connects each bottom electrode 209 to an active region 213 on a substrate 215.

The active regions 213 are electrically isolated from one another on the substrate 215 by STI regions 216.

Referring in particular to FIG. 11B, a sense line 217 runs underneath each bit line. The sense line 217 does not contact the bit lines 201, the MTJs or the bottom electrodes 209. A via 219 connect the sense line 217 to the active region 213.

Referring in particular to FIG. 12A, each sense line 217 weaves side to side about a longitudinal axis. The longitudinal axis is parallel to the x-axis. Each active region 213 also weaves side to side about a longitudinal axis that is parallel to the x-axis.

The pitch of the weave of the sense line 217 is the same as the pitch of the weave of the active region 213. The weaves are 180° out of phase such that the weave of the sense line 217 and the weave of the active layer 213 coincide at and are contacted by vias 219.

Where the sense line 217 and the active layer 213 are furthest away from each other, the vias 211 connecting the bottom electrodes 209 to the active region 213 are provided. Therefore, the sense line 217 is spaced apart from the vias 211 connecting the bottom electrode 209 to the active region 213.

Referring in particular to FIG. 12C, a plurality of word lines 221 are provided on the substrate 215 and are isolated therefrom by a gate oxide 221a. The word lines 221 ate perpendicular to the bit lines 201. The word lines 221 are arranged in a second direction, herein defined as the y-axis. The word lines 221 are isolated from the sense lines by an insulating matrix 223. Each word line 221 is provided between the vias 219 connecting the sense line 217 to the active region 213 and the vias 211 connecting the bottom electrode 209 to the active region 213.

The word lines 221 define a second dimension of the array, in this example columns of the array. Two word lines 221 are provided for each MTJ 207. Therefore, each column of the array is defined by the two word lines 221 on either side of a column of MTJs 207.

Referring in particular to FIG. 12C, a source region 227 is provided in the active region 213 below each via 211 connecting the bottom electrode 209 to the active region 213. A drain region 229 is provided in the active region 213 below each via 219 connecting the sense line 217 to the active region 213. Conduction between each source region 227 and the drain region 229 occurs through the word line 221 between said regions. Therefore, said word line 221 serves as a gate 231 of an isolation transistor 233.

Two transistors 233 are provided for each MTJ 207, therefore each memory cell 235 is defined by one MTJ 207 and two transistors 233. The drain region 229 of each transistor 233 is shared between neighbouring memory cells 235. The area of each memory cell 235 is 8 $F^2$.

The feature size F of the memory array is between 50 nm and 100 nm.

Referring to FIG. 13, control circuitry for the memory array is shown.

A write driver 236 and a sense amplifier 237 are provided for each tow of the memory array. Each bit line 201 is connected to a first output 238 of the respective write driver 236. Each sense line 217 is connected to a second output 239 of the respective write driver 237. Each bit line 201 is also connected to a first input/output port 240 of the respective sense amplifier 237.

A connection 241 is provided between a second output of the sense amplifier 237 and a first input of the respective write driver 236.

The write driver 236 has a second input 242 for applying a write amplifier enable (WAE) voltage.

The sense amplifier 237 has a second input 243 for applying a sense amplifier enable (SAE) voltage. The sense amplifier 237 has a third input/output port 244 for applying a sense amplifier input/output (SAIO) voltage.

A single word line driver 245 is provided. Each word line 221 is connected to a respective output of word line driver 245.

Each MTJ 207 connects a bit line 201 to the sense line 217 in the same row, through one of two isolation transistors 233 either side of the MTJ 207. The base of each isolation transistor 233 is connected to a single word line 221. Current will flow through the MTJ 207 when a bias is applied to both of the word lines 221 defining the column the memory cell 235, and a bias is applied to the bit line 201 or sense line 203 defining the row of the MTJ 207. In this way, each MTJ 207 is addressable by two word lines 221 and a single bit line 201 or sense line 217.

Addressing each MTJ 207 by two word lines 221 reduces the current through the isolation transistors 233. This can be advantageous because the maximum pass current of the isolation transistors 233 places an upper limit on the current that can be used in STT switching.

Device Operation

Reading and writing of the memory cell shown in FIGS. 12A to 12C is the same as that described earlier with respect to the memory cell shown in FIGS. 3A to 3D.

Device Fabrication

The steps of the fabrication process for the memory cell shown in FIGS. 12A to 12C is the same as that described earlier with respect to the memory cell shown in FIGS. 3A to 3D.

Alternative MTJ Structure

Referring to FIG. 14, a cross section of an alternative MTJ 247 taken through the x-z plane is shown. The MTJ 247 can be used instead of MTJ 37 in the first embodiment or MTJ 207 in the second embodiment.

The MTJ 247 comprises a sequence of layers, including a free layer 249, a tunnel barrier layer 251, and a pinned layer 253. In this example, the free layer is furthest from the substrate and the pinning layer is closest to the substrate.

The free layer 249 comprises a ferromagnetic material. The free layer 249 has a relatively low coercivity, so that it can be switched on application of a switching current or magnetic field.

The tunnel barrier layer 251 is formed of an insulating material, such as magnesium oxide (MgO), and is sufficiently thin that electrons can tunnel through it.

The pinner layer 253 comprises a ferromagnetic material. The pinned layer 253 is thicker than the free layer 249. This provides it with a higher coercivity than the free layer 249. Therefore, the free layer 249 is able to switch upon the application of the switching current and assist magnetic field, and the pinned layer 253 is not able to switch upon application of the switch current and assist magnetic field.

Referring to FIG. 15, a cross section in the x-z plane of another alternative MTJ 255 is shown. The MTJ 255 can also be used instead of the MTJ 37 in the first embodiment or the MTJ 207 in the second embodiment.

The MTJ 255 comprises a sequence of layers, including a free layer 257, a tunnel barrier layer 259, a pinned layer 261, and a pinning layer 263. In this example, the free layer is furthest from the substrate and the pinning layer is closest to the substrate.

The free layer 257 comprises a ferromagnetic material. The free layer 257 has a relatively low coercivity, so that it can be switched on application of a switching current or magnetic field.

The tunnel barrier layer 259 is formed of an insulating material, such as magnesium oxide (MgO), and is sufficiently thin that electrons can tunnel through it.

The pinner layer 261 comprises a ferromagnetic material. The pinned layer 261 has a relatively high coercivity, so that it is not switched on application of a switching current or magnetic field.

The pinning layer 263 comprises an antiferromagnetic material. The pinning layer 263 pins the magnetisation of the pinned layer 261, to prevent the magnetisation of the pinned layer 261 from switching on application of a magnetic field or a switching current.

The alternative MTJs 247, 255 have the advantage of a simpler structure than the MTJ 37 used in the first embodiment and the MTJ 207 used in the second embodiment. Therefore, the alternative MTJs 247,255 are simpler to fabricate. However, the alternative MTJs 247, 255 do not exhibit a magnetoresistance ratio has high as that exhibited as the MTJ 37 and the MTJ 207.

In another example (not shown), the MTJ is provided with an additional ferromagnetic layer overlying the free layer. The additional ferromagnetic layer is separated from the ferromagnetic layer by a non-magnetic conductor. The additional ferromagnetic layer can increase the proportion of spin-polarised electrons injected into the free layer when current flows from the pinned layer to the free layer.

In yet another example (not shown), a spin valve is provided instead of an MTJ. The spin valve comprises a sequence of layers, including a ferromagnetic free layer and a ferromagnetic pinned layer separated by a nonmagnetic conductor.

It will be appreciated that many modifications may be made to the embodiments described above.

For example, the duration and value of the pre-charging section of the current pulse can be adjusted depending on the composition of the MTJ. The duration of the pre-charging section of the current pulse required is related to the Gilbert damping constant of the free layer.

In addition, the orientation of the MTJs with respect to the bit line and sense line can be varied.

The dimensions of the MTJ can also be varied. However, an MTJ with an elliptical cross section has an improved thermal stability due to the magnetic shape anisotropy provided.

The invention claimed is:

1. A method of writing to a magnetic memory device comprising first and second leads, and a magnetoresistive multilayer structure arranged between said leads, said multilayer structure exhibiting a first, relatively high resistance state and a second, relatively low resistance state, the multilayer structure being switchable from the first state to the second state in response to a pulse of given duration and magnitude, the pulse magnitude being a current threshold magnitude which is a minimum current magnitude needed to switch the multilayer structure and which is dependent upon the duration of the pulse, the method comprising:

passing a current through the multilayer structure of first magnitude less than said threshold current magnitude for a duration less than the given duration, and increasing the current through the multilayer structure thereby passing a current of second, higher magnitude which is less than said threshold current magnitude so as to cause the multilayer structure to switch from the first state to the second state.

2. A method according to claim 1, wherein passing the current through the multilayer structure comprises:

passing the current through the multilayer structure of first magnitude between 0.1 and 0.5 of said current threshold magnitude.

3. A method according to claim 1, wherein passing the current through the multilayer structure of first magnitude comprises:

passing the current through the multilayer structure for between 0.1 and 0.4 of the given duration.

4. A method according to claim 3, wherein the given duration is less than 10 ns.

5. A method according to claim 1, wherein passing the current through the multilayer structure of first magnitude comprises:

passing the current through the multilayer structure at a fixed level for the duration.

6. A method according to claim 1, wherein passing the current through the multilayer structure comprises:

passing a current through the multilayer structure of first magnitude less than said threshold current magnitude for a duration between 1 ns and 2 ns.

7. A method according to claim 1, wherein increasing the current comprises:

increasing the current to a second magnitude between 0.3 and 0.5 of said threshold magnitude.

8. A method according to claim 1, wherein increasing the current comprises:

increasing the current to a predetermined level and holding the current at that level for a period less than the given duration.

9. A method according to claim 1, wherein increasing the current comprises:

increasing the current to a predetermined level and holding the current at that level for a period between 0.1 and 0.4 of the given duration.

10. A method according to claim 9, wherein the given duration is less than 10 ns.

11. A method according to claim 1, wherein increasing the current comprises:

increasing the current to a predetermined level an holding the current at a fixed level.

12. A method according to claim 1, further comprising:

ramping current from a base current level to a predetermined current level.

13. A method according to claim 12, further comprising:

ramping current down from the level of the current of a second, higher magnitude to the base level.

14. A method according to claim 1, further comprising:

ramping current from a zero current level to a predetermined current level.

15. A method according to claim 1, further comprising:

ramping current up from the predetermined current level to the level of the current of a second, higher magnitude.

16. A method according to claim 1, further comprising:

ramping current down from the level of the current of a second, higher magnitude to a lower level.

17. A method according to claim 1, wherein the current threshold magnitude I needed to switch the multilayer structure is:

$$I = I_{c0}(1 + C \cdot t_p^{-1})$$

where $I_{c0}$ is a DC threshold current being the minimum DC current needed to switch the multilayer structure, C is a constant, and $t_p$ is the duration of the pulse.

18. A memory comprising:

a magnetic memory device comprising:

first and second leads;

a magnetoresistive multilayer structure arranged between said leads, said multilayer structure exhibiting a first, relatively high resistance state and a second, relatively low resistance state, the multilayer structure being switchable from the first state to the second state in response to a pulse of given duration and magnitude, the pulse magnitude being a current threshold magnitude which is a minimum current magnitude needed to switch the multilayer structure and which is dependent upon the duration of the pulse; and circuitry for controlling the magnetic memory device configured to perform a method according to claim 1.

19. A method according to claim 1, wherein passing the current through the multilayer structure comprises:

passing the current through the multilayer structure of first magnitude less than or equal to a DC threshold current, being the minimum DC current needed to switch the multilayer structure.

* * * * *